(12) United States Patent
Ishiura

(10) Patent No.: US 9,800,021 B2
(45) Date of Patent: Oct. 24, 2017

(54) SEMICONDUCTOR LASER DEVICE AND MANUFACTURING METHOD OF THE SAME

(71) Applicant: Sumitomo Electric Device Innovations, Inc., Yokohama-shi (JP)

(72) Inventor: Masami Ishiura, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/696,102

(22) Filed: Apr. 24, 2015

(65) Prior Publication Data

US 2015/0311674 A1   Oct. 29, 2015

(30) Foreign Application Priority Data

Apr. 25, 2014 (JP) ................. 2014-091042
Feb. 17, 2015 (JP) ................. 2015-028474

(51) Int. Cl.

| | |
|---|---|
| *H01S 5/22* | (2006.01) |
| *H01S 5/227* | (2006.01) |
| *H01S 5/02* | (2006.01) |
| *H01S 5/026* | (2006.01) |
| *H01S 5/10* | (2006.01) |
| *H01S 5/12* | (2006.01) |
| *H01S 5/30* | (2006.01) |
| *H01S 5/343* | (2006.01) |

(52) U.S. Cl.
CPC .......... *H01S 5/2275* (2013.01); *H01S 5/1206* (2013.01); *H01S 5/0202* (2013.01); *H01S 5/0265* (2013.01); *H01S 5/1014* (2013.01); *H01S 5/1203* (2013.01); *H01S 5/1231* (2013.01); *H01S 5/2222* (2013.01); *H01S 5/305* (2013.01); *H01S 5/34306* (2013.01)

(58) Field of Classification Search
CPC ........ H01S 5/12; H01S 5/0425; H01S 5/2018; H01S 5/2275
See application file for complete search history.

(56) References Cited

U.S. PATENT DOCUMENTS

| | | | |
|---|---|---|---|
| 6,175,581 B1 * | 1/2001 | Sato .......................... | H01S 5/12 372/50.11 |
| 6,259,718 B1 * | 7/2001 | Okuda ...................... | H01S 5/12 372/102 |

FOREIGN PATENT DOCUMENTS

JP   05-029703 A   2/1993

* cited by examiner

*Primary Examiner* — Armando Rodriguez
(74) *Attorney, Agent, or Firm* — Venable LLP; Michael A. Sartori; Miguel A. Lopez

(57) ABSTRACT

A semiconductor laser device having a diffraction grating is disclosed. The semiconductor laser device comprises a first diffraction grating provided on a substrate, a second diffraction grating continuous to one end of the first diffraction grating along an optical waveguide direction, and an active layer provided above the first diffraction grating. The second diffraction grating has a pitch 1.05 times or greater, or 0.95 times or smaller of the pitch of the first diffraction grating.

10 Claims, 24 Drawing Sheets ized so that a laser oscillation wavelength becomes 1.5 μm, and a Bragg wavelength of 1.3 μm by a diffraction grating;

SEMICONDUCTOR LASER DEVICE AND MANUFACTURING METHOD OF THE SAME

BACKGROUND

1. Field of the Invention

The present invention relates to a semiconductor laser device and a manufacturing method of the semiconductor laser device.

2. Background Arts

Japanese Patent Application Laid-Open No. H5-029703 discloses a semiconductor laser device including a diffraction grating. As a method for forming a diffraction grating, an electron beam exposure is known. When a diffraction grating is formed on a wafer using the electron beam exposure, a portion where no diffraction grating is lithographed is provided between adjacent diffraction gratings along an optical waveguide of the diffraction grating. When the wafer is cleaved to form respective devices and the optical grating extends in the cleaved facet of the device, the optical grating terminated at the cleaved facet degrades the performance of the whole device. On the other hand, when a portion where no diffraction grating is lithographed is provided between the diffraction gratings, conditions to grow semiconductor layers on the diffraction grating become inhomogeneous between an area where the diffraction grating is formed and another area where no diffraction grating is formed, which may cause or arise defects arising from a boundary between two areas. When such defects are arose in the device, luminescent efficiency of the semiconductor laser device degrades.

SUMMARY

One aspect of the present application relates to a semiconductor laser device that comprises a first diffraction grating provided on a substrate, a second diffraction grating continuous to one end of the first diffraction grating, the first diffraction grating and the second diffraction grating being provided along an optical waveguide direction, and an active layer provided above the first diffraction grating. A feature of the semiconductor laser device of the present application is that the second diffraction grating has a pitch 1.05 times or greater, or 0.95 times or smaller of the pitch of the first diffraction grating.

Another aspect of the present application relates to a method of manufacturing a semiconductor laser device that comprises: forming a first diffraction grating and a second diffraction grating on a wafer continuously by the continuous electron beam exposure; and forming an active layer above the first diffraction grating and the second diffraction grating. A feature of the method is that a pitch of the first diffraction grating is different from a pitch of the second diffraction grating.

Still another aspect of the present application relates to a method of manufacturing a semiconductor laser device that comprises: forming a third diffraction grating and a fourth diffraction grating continuous to the third diffraction grating on a wafer by an electron beam exposure, the third diffraction grating having a stripe width and the fourth diffraction grating having a width wider than the stripe width of the third diffraction grating; forming an active layer above the third diffraction grating and the fourth diffraction grating; and forming a mesa stripe by etching the third diffraction grating, the fourth diffraction grating, and the active layer, the mesa stripe in a portion corresponding to the third diffraction grating having a stripe width equal to or narrower than the stripe width in another portion corresponding to the third diffraction grating.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Description of Embodiments

Figure 1:
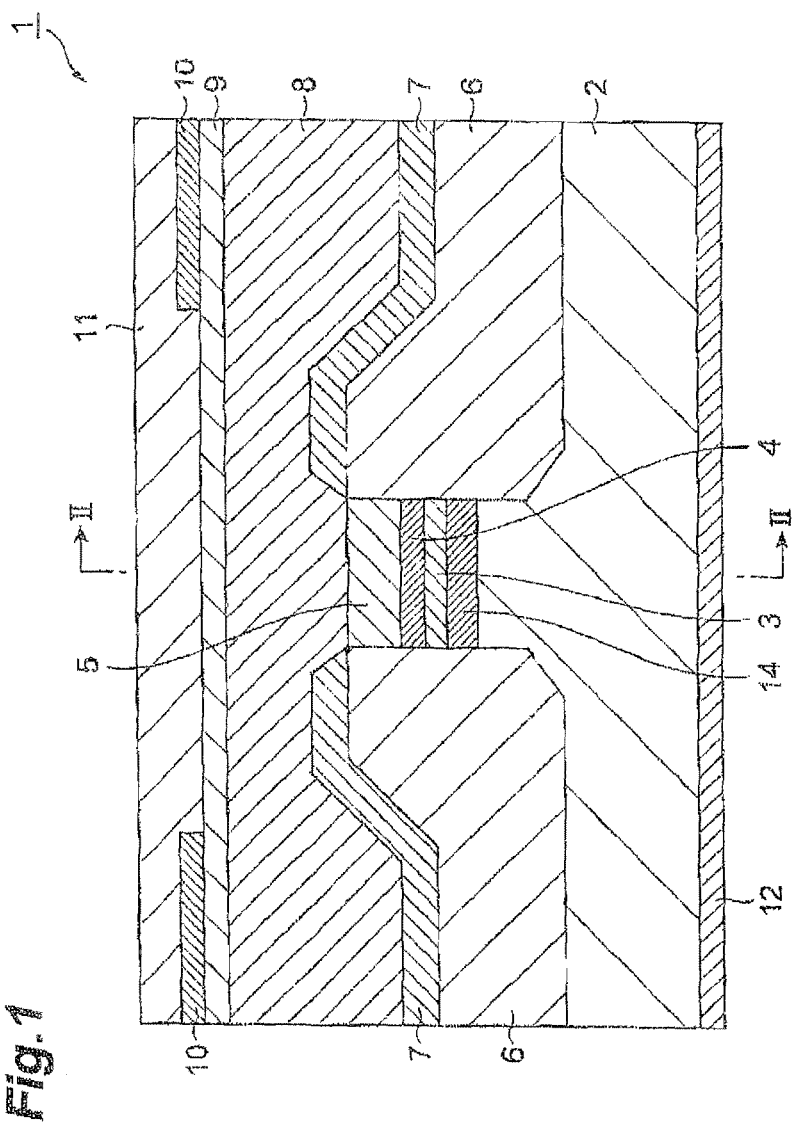
FIG. 1 is a diagram illustrating a cross-section of a semiconductor laser device according to the present embodiment, the cross-section perpendicular to an optical waveguide direction.

First of all, embodiments of the invention of the present application will be described.

A semiconductor laser device according to an embodiment of the present invention comprises a first diffraction grating provided on a substrate along an optical waveguide direction, a second diffraction grating provided on the substrate and continuous to one end of the first diffraction grating, where the second diffraction grating extends along the optical waveguide direction, and an active layer provided above the first diffraction grating and generating light with a wavelength determined by the first diffraction grating. The second diffraction grating has a pitch 1.05 times or greater, or 0.95 times or smaller of the pitch of the first diffraction grating.

According to this semiconductor laser device, because the second diffraction grating is continuous to the one end of the first diffraction grating, defects are not likely to occur in semiconductor layers grown on the first diffraction grating corresponding to the end of the first diffraction grating. It is therefore possible to prevent the defects from spreading within the active layer. Further, because the pitch of the second diffraction grating is set 1.05 times or greater, or 0.95 times or smaller of the pitch of the first diffraction grating, it is possible to prevent the second diffraction grating from affecting the laser oscillation of the semiconductor laser device.

The second diffraction grating may have a cleaved surface in another end thereof opposite to the one end.

The active layer may be provided on the second diffraction grating.

The semiconductor laser device may further comprise a waveguide layer provided above the second diffraction grating. The waveguide layer may be configured to guide light generated in the active layer.

The semiconductor laser device may further comprise a modulation region provided above the second diffraction grating. The modulation layer may be configured to modulate light generated in the active layer.

The active layer may further comprise an n-type cladding layer, and a p-type cladding layer each made of InP, where the active layer may be made of AlInGaAs, and provided between the n-type cladding layers and the p-type cladding layer.

A method of manufacturing the semiconductor laser device according to an embodiment of the present invention comprises steps of: forming a first diffraction grating and a second diffraction grating on a wafer continuously by a continuous electron beam exposure, where the first diffraction grating has a pitch different from a pitch of the second diffraction grating; and forming an active layer above the first diffraction grating and the second diffraction grating.

Because the second diffraction grating is continuously formed in one end of the first diffraction grating, defects are not likely to be arose in layers grown on the first diffraction grating in a portion corresponding to the end of the first diffraction grating. It is therefore possible to prevent the defects from spreading into the active layer.

The method may further comprise steps of: etching the active layer in a portion formed above the second diffraction grating; and forming a waveguide layer above the second diffraction grating.

The method may further comprise steps of: etching the active layer in a portion formed above the second diffraction grating; and forming a modulation region above the second diffraction grating.

In the method, the step of forming the second diffraction grating may include a step to set the pitch thereof to be 1.05 times or greater, or 0.95 times or smaller of the pitch of the first diffraction grating. Accordingly, the second diffraction grating may be prevented from affecting the laser oscillation of the semiconductor laser device.

The method may further comprise a step of cleaving the wafer at a portion of the second diffraction grating.

An abnormal growth may occur in semiconductor layers embedding the diffraction grating which is exposed to electron beams several times. The abnormal growth may degrade the luminescent efficiency of the semiconductor laser device. To reduce such an abnormal growth, the step of forming the first diffraction grating and the second diffraction grating may include: forming a grating layer on the wafer; forming a plurality of exposed regions on the grating layer each including at least one first pattern and one second pattern continuous to the first pattern along an optical waveguide direction, where the first pattern corresponds to the first diffraction grating and the second pattern corresponds to the second diffraction grating; and etching the grating layer by the exposed regions as a mask. A feature of the method is that the exposed regions are discretely arranged along the optical waveguide direction. Because the exposed regions do not overlap with each other along the optical waveguide direction, no portion exposed to the electron beams several times. Accordingly, the abnormal growth in the first diffraction grating and the second diffraction grating may be suppressed.

The step of forming the first diffraction grating and the second diffraction grating may further comprise steps of: forming a grating layer on a substrate; and forming a plurality of exposed regions by an electron beam exposure, each exposed regions including a first pattern with a first width and a second patterns putting the first pattern therebetween, where the first pattern corresponds to the first diffraction grating and the second pattern corresponds to the second diffraction gratings, the second pattern involved in one exposed region in a portion continuous to the second pattern involved in another exposed region next to the one exposed region being exposed to the electron beam at least twice and having a width greater than the first width of the first pattern. The method may further comprise a step, after the step of forming the active layer, etching the first diffraction grating, the second diffraction grating, and the active layer to form a mesa stripe with a width equal to or narrower than the first width of the first pattern.

A method of manufacturing the semiconductor laser device according to another embodiment of the present invention comprises steps of: forming a third diffraction grating and a fourth diffraction grating continuous to the third diffraction grating on a wafer continuously by an electron beam exposure, where the third diffraction grating has a stripe width and the fourth diffraction grating has a width wider than the strip width of the third diffraction grating; forming an active layer above the third diffraction grating and the fourth diffraction grating; and forming a mesa stripe by etching the third diffraction grating, the fourth diffraction grating, and the active layer, where the mesa stripe in has a stripe width equal to or narrower than the width of the third diffraction grating.

Even if defects are arose in semiconductor layers grown on the diffraction gratings, especially in a boundary between the fourth diffraction gratings along; the defects are localized at corners of the boundary. Most of the defects are removed by removing the corners of the boundary by etching. It is therefore possible to prevent the defects from spreading into the active layer.

The method may further comprise a step of cleaving the wafer in the fourth diffraction grating.

The method may further comprise steps of etching the active layer formed above the fourth diffraction grating; and forming a waveguide layer above the fourth diffraction grating.

The method may further comprise steps of etching the active layer formed above the fourth diffraction grating; and forming a modulation region above the fourth diffraction grating.

Details of Embodiments

Specific examples of a semiconductor laser device and a manufacturing method of a semiconductor laser device of the present invention will be described below with reference to the accompanying drawings. It should be noted that the present invention is not limited to these examples but shown in the claims, and it is intended that all modifications that come within the meaning and range of equivalence to the claims should be embraced herein. In the description, the same elements or elements having the same function are denoted with the same reference signs, and an overlapping description will be omitted.

First Embodiment

Figure 2:
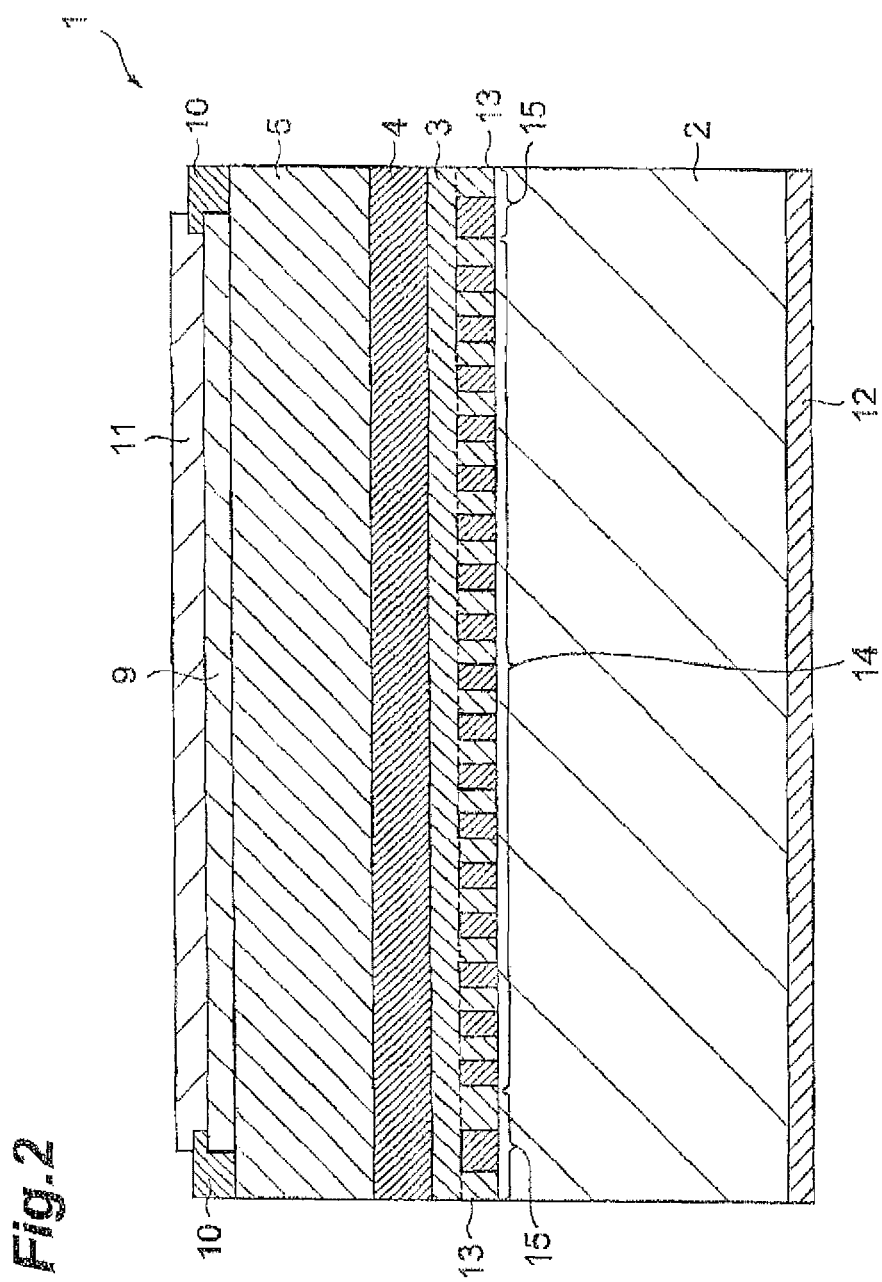
FIG. 2 is a cross-sectional view taken along a line II-II of FIG. 1.

FIG. 1 is a diagram illustrating a cross-section of a semiconductor laser device 1 according to the present embodiment, where the cross-section is perpendicular to an optical waveguide. FIG. 2 is a cross-sectional view along line II-II denoted in FIG. 1. The semiconductor laser device 1 includes an n-type InP substrate 2, an n-type InP cladding layer 3, an active layer 4, a p-type InP cladding layer 5, a p-type InP blocking layer 6, an n-type InP blocking layer 7, a p-type InP layer 8, a contact layer 9, a protective film 10, a p-type electrode 11 and an n-type electrode 12.

The n-type InP cladding layer 3, the active layer 4 and the p-type InP cladding layer 5 are sequentially grown on the n-type InP substrate 2. These n-type InP cladding layer 3, the active layer 4 and the p-type InP cladding layer 5 have a mesa stripe (mesa). The height of this mesa is, for example, 2.0 μm. The mesa is formed in a center of the n-type InP substrate 2 in a lateral direction perpendicular to an optical waveguide direction.

The n-type InP substrate 2 is doped with Si (silicon) by a concentration of $1.0 \times 10^{18}/cm^3$. The n-type InP cladding layer 3 is doped with Si (silicon) by a concentration of $1.0 \times 10^{18}/cm^3$. The thickness of the n-type InP cladding layer 3 is, for example, 0.5 μm. The active layer 4 has, for example, a multi quantum well (MQW) structure including AlInGaAs. The p-type InP cladding layer 5 is doped with Zn by a concentration of $1.0 \times 10^{18}/cm^3$. The thickness of the p-type InP cladding layer 5 is for example, 0.2 μm.

A first diffraction grating 14 and a second diffraction grating 15 are formed inside the n-type InP cladding layer 3. The first diffraction grating 14 and the second diffraction grading 15 include, for example, AlInGaAs, or the like.

Refractive indices of the first diffraction grating 14 and the second diffraction grating 15 are different from a refractive index of the n-type InP cladding layer 3. The second diffraction gratings 15 are adjacent to respective ends of the first diffraction grating 14 in the optical waveguide direction. That is, the second diffraction gratings 15 put the first diffraction grating 14 therebetween in the optical waveguide direction. An end opposite to an end facing the first diffraction grating 14 forms a cleaved face (exit face) 13. A pitch of the second diffraction grating 15 is 1.05 times or greater, or 0.95 times or smaller of a pitch of the first diffraction grating 14. The pitch of the second diffraction grating 15 may be preferably 0.8 times or smaller, or 1.2 times or greater of the pitch of the first diffraction grating 14. For example, when the pitch of the first diffraction grating 14 is designed to be 0.24 μm, a laser oscillation wavelength becomes 1.500 μm. Therefore, the pitch of the second diffraction grating may be 0.228 μm or smaller, or 0.252 μm or greater. The pitch of the second diffraction grating 15 may be further preferably 0.192 μm or smaller, or 0.288 μm or greater, preferably. While FIG. 2 illustrates an example where an active layer 4 is formed above the first diffraction grating 14 and the second diffraction grating 15, a waveguide layer for guiding light generated in the active layer 4 may be formed above the second diffraction grating 15. This waveguide layer may have an MQW structure or a bulk structure as long as the waveguide layer does not provide an optical gain different from that of the active layer 4.

The p-type InP blocking layer 6 and the n-type InP blocking layer 7 are sequentially formed on the n-type InP substrate 2 so as to embed the mesa stripe. The p-type InP blocking layer 6 is doped with Zn by a concentration of $4.0 \times 10^{17}/cm^3$. The thickness of the p-type InP blocking layer 6 is, for example, 3.0 μm. The n-type InP blocking layer 7 is doped with Si by a concentration of $1.0 \times 10^{19}/cm^3$. The thickness of the n-type InP blocking layer 7 is, for example, 0.4 μm.

The p-type InP layer 8 and the contact layer 9 are provided so as to cover the p-type InP cladding layer 5 and the p-type InP blocking layer 7. The p-type InP layer 8 and the contact layer 9 are sequentially formed. The p-type InP layer 8 is doped with Zn by a concentration of $1.2 \times 10^{18}/cm^3$. The thickness of the p-type InP layer 8 is, for example, 2.0 μm. The contact layer 9 is, for example, made of an InGaAs layer doped with Zn by a concentration of $1.2 \times 10^{19}/cm^3$. The thickness of the contact layer 9 is, for example, 0.5 μm. The contact layer 9 has band-gap energy smaller than band-gap energy of the p-type InP layer 8. The p-type InP layer 8 functions as a part of the p-type InP cladding layer 5.

The protective film 10 is formed on the contact layer 9. The protective film 10 exposes a portion of the contact layer 9 above the mesa stripe. The protective film 10 is an insulating film and is made of, for example, $SiO_2$, or the like. The p-type electrode 11 covers a region where the protective film 10 is not provided, and the top of the protective film 10. The p-type electrode 11 is, for example, a metal stack of titanium (Ti), platinum (Pt) and gold (Au). The n-type electrode 12 is formed on a back surface of the n-type InP substrate 2. The n-type electrode 12 is another metal stack of, for example, gold (Au), germanium (Ge) and nickel (Ni).

A manufacturing method of the semiconductor laser device 1 according to the present embodiment will be described next.

Figure 3:
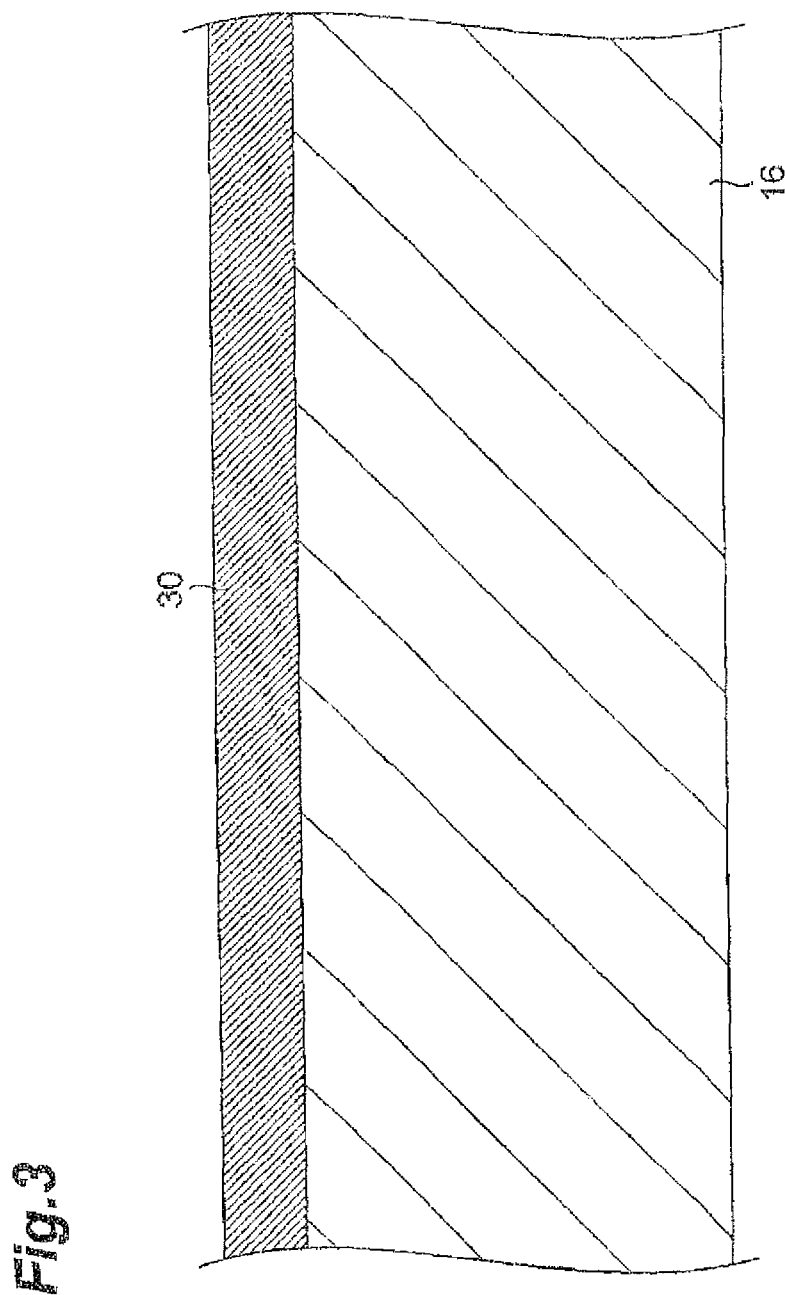
FIG. 3 is a diagram illustrating a manufacturing step of the semiconductor laser device.
Figure 4:
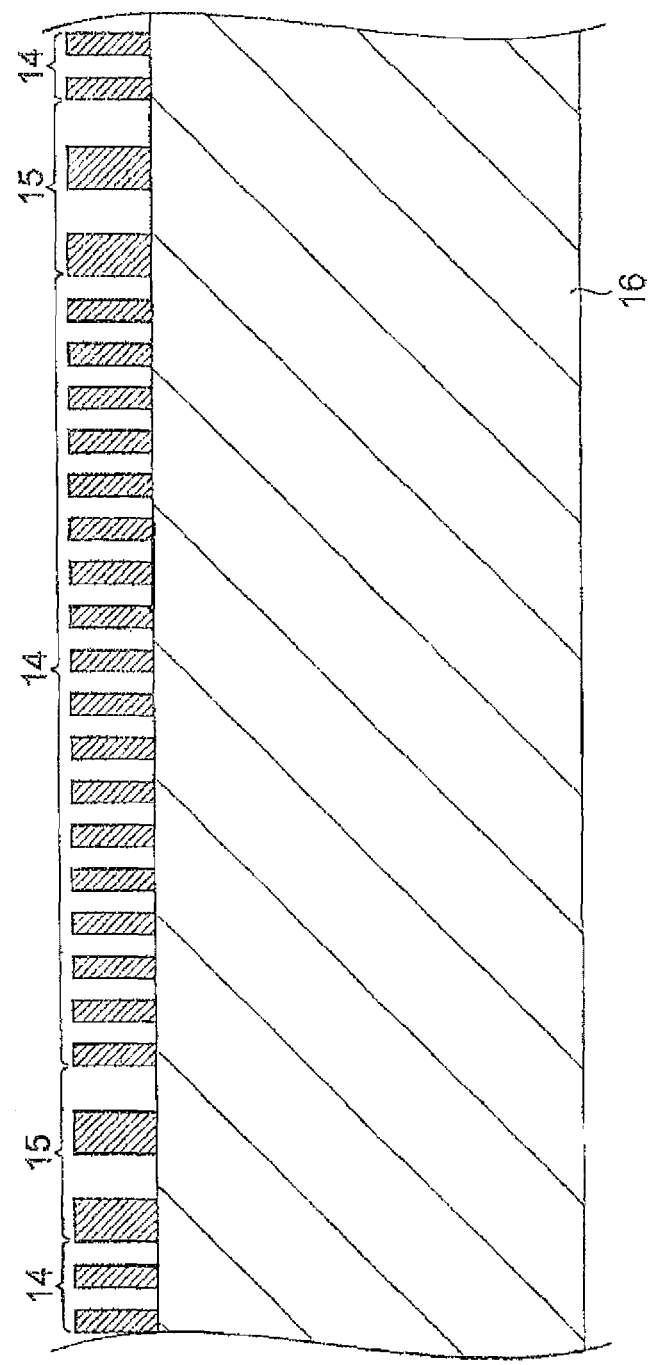
FIG. 4 is a diagram illustrating a manufacturing step of the semiconductor laser device.
Figure 5:
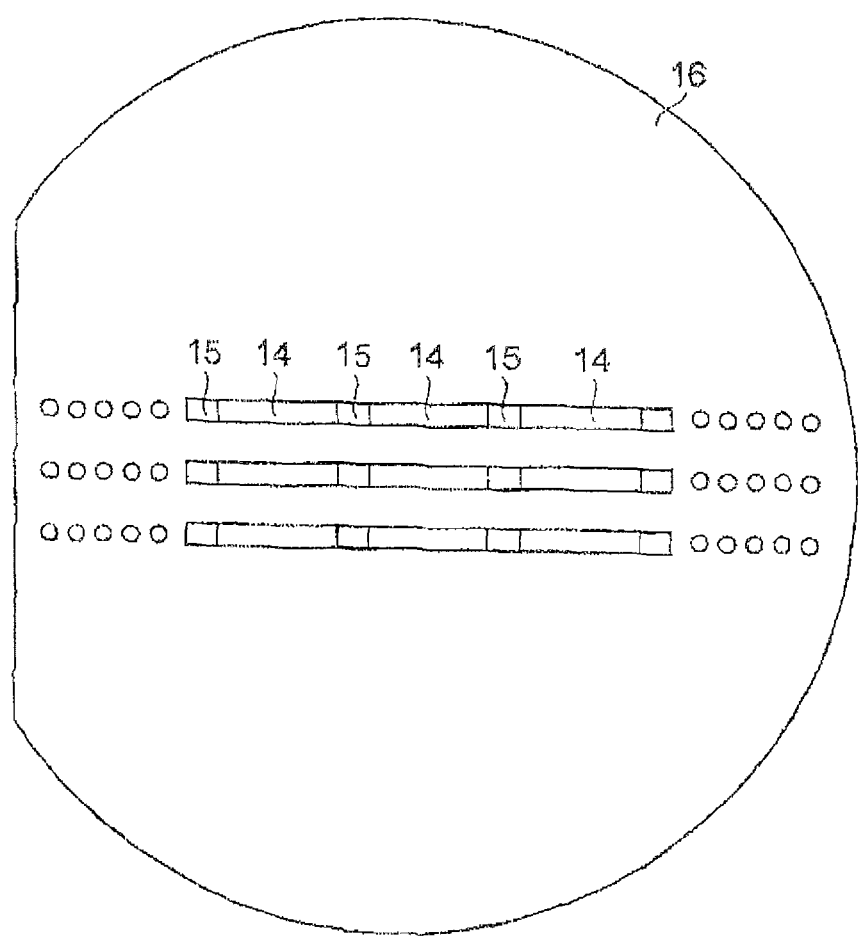
FIG. 5 is a diagram illustrating a manufacturing step of the semiconductor laser device.
Figure 6:
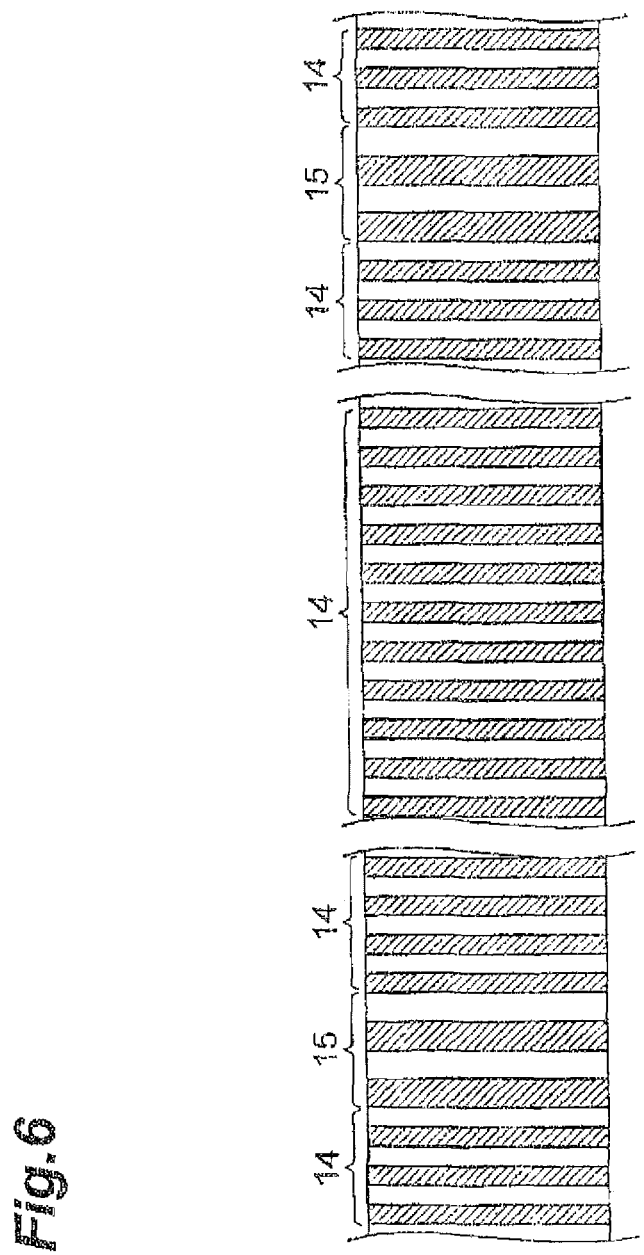
FIG. 6 is a diagram illustrating a manufacturing step of the semiconductor laser device.

FIGS. 3 to 13 are diagrams illustrating manufacturing steps of the semiconductor laser device. FIG. 3, FIG. 4, FIG. 7 and FIG. 8 are cross-sectional views of the semiconductor laser device taken along the optical waveguide direction thereof. FIG. 5 and FIG. 6 are external appearances of the semiconductor laser device viewed from the direction perpendicular to the principal surface of a wafer 16. FIGS. 9 to 13 are cross-sectional views of the semiconductor laser device taken along the direction perpendicular to the optical waveguide direction. The wafer 16 becoming part of the semiconductor laser device 1 is referred to as the n-type InP substrate 2.

Figure 7:
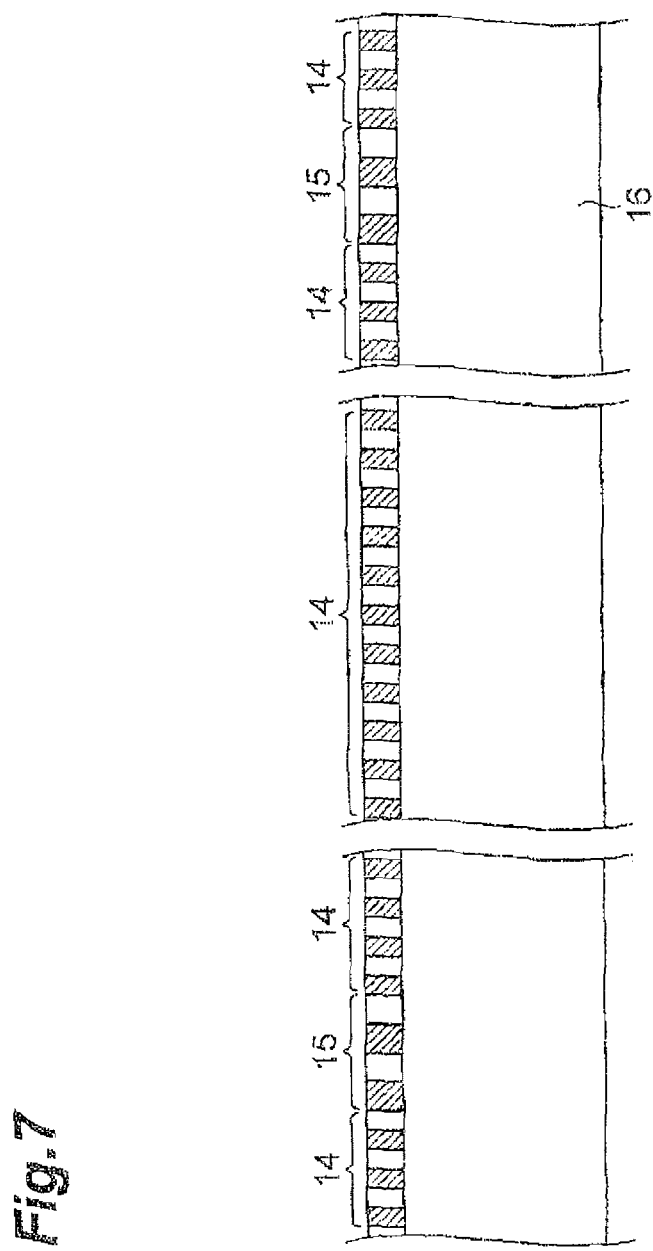
FIG. 7 is a diagram illustrating a manufacturing step of the semiconductor laser device.

As illustrated in FIG. 3, a diffraction grating layer 30 is grown on the principal surface of the wafer 16. Then, as illustrated in FIG. 4, the first diffraction grating 14 and the second diffraction grating 15 are formed using an electron beam exposure. FIG. 5 is a diagram of the wafer 16 illustrated in FIG. 4, viewed from a direction perpendicular to the principal surface of the wafer 16. FIG. 6 magnifies a primary portion of the semiconductor laser device 1 illustrated in FIG. 5. FIG. 7 is a view of the semiconductor laser device illustrated in FIG. 6, which is viewed from a lateral direction perpendicular to the optical waveguide direction.

As illustrated in FIG. 4 to FIG. 7, the second diffraction grating 15 having a pitch different from a pitch of the first diffraction grating 14 is formed between the first diffraction gratings 14 so as to continue the first diffraction gratings 14. The pitch of the first diffraction grating 14 and that of the second diffraction grating 15 are set as follows. That is, the pitch of the second diffraction grating 15 is set 0.95 times or smaller, or 1.05 times or greater of the pitch of the first diffraction grating 14. The pitch of the second diffraction grating 15 may be further preferably set to be 0.8 times or smaller, or 1.2 times or greater for the pitch of the first diffraction grating 14. The pitch of the first diffraction grating 14 is designed, when the oscillation wavelength of the semiconductor laser device becomes 1.500 μm, to be 0.24 μm. In this case, the pitch of the second diffraction grating is set 0.228 μm or smaller, or 0.252 μm or greater. The pitch of the second diffraction grating 15 may be further preferably 0.192 μm or smaller, or 0.288 μm or greater.

Process for forming patterns of the first diffraction grating 14 and the second diffraction grating 15 will be specifically described as follows. The wafer 16 on which the diffraction grating layer 30 is formed is heated prior to resist works (hereinafter, referred to as "pre-heating"). After pre-heating, a resist is applied on the diffraction grating layer 30, then, the wafer 16 and the resist are heated (hereinafter, referred to as "pre-baking"). At this time, a temperature of the pre-heating may be, for example, 180° C., and the thickness of the applied resist may be, for example, 1500 Å. A temperature of the pre-baking may be, for example, 140° C., and a time of the pre-baking may be, for example, three minutes. Then, fine patterns are lithographed in the resist for forming the first diffraction grating 14 and the second diffraction grating 15 using a probe current of the electron beam exposure. At this time, the probe current may be, for example, between 0.1 and 1.0 nA (nano-ampere). Then, the wafer 16 on which the resist is provided is immersed in a developer. At this time, a time during which the wafer 16 is immersed in the developer may be, for example, thirty seconds (30 sec.). Then, the wafer 16 taken out from the developer is heated (hereinafter, referred to as "post-baking"). A temperature of the post-baking may be for example, 140° C., a time of the post-baking may be, for example, three minutes. These processes form the striped patterns by the resist on the wafer 16. The striped patterns have a first pitch and a second pitch. Subsequently, an etching process is performed on part of the diffraction grating layer 30 using the patterned resist as a mask. Then, after the remaining resist is removed, the first diffraction grating 14 and the second diffraction grating 15 having pitches different from each other are formed on the substrate 2. A nano-imprinting method may be used instead of the electron beam exposure.

Figure 8:
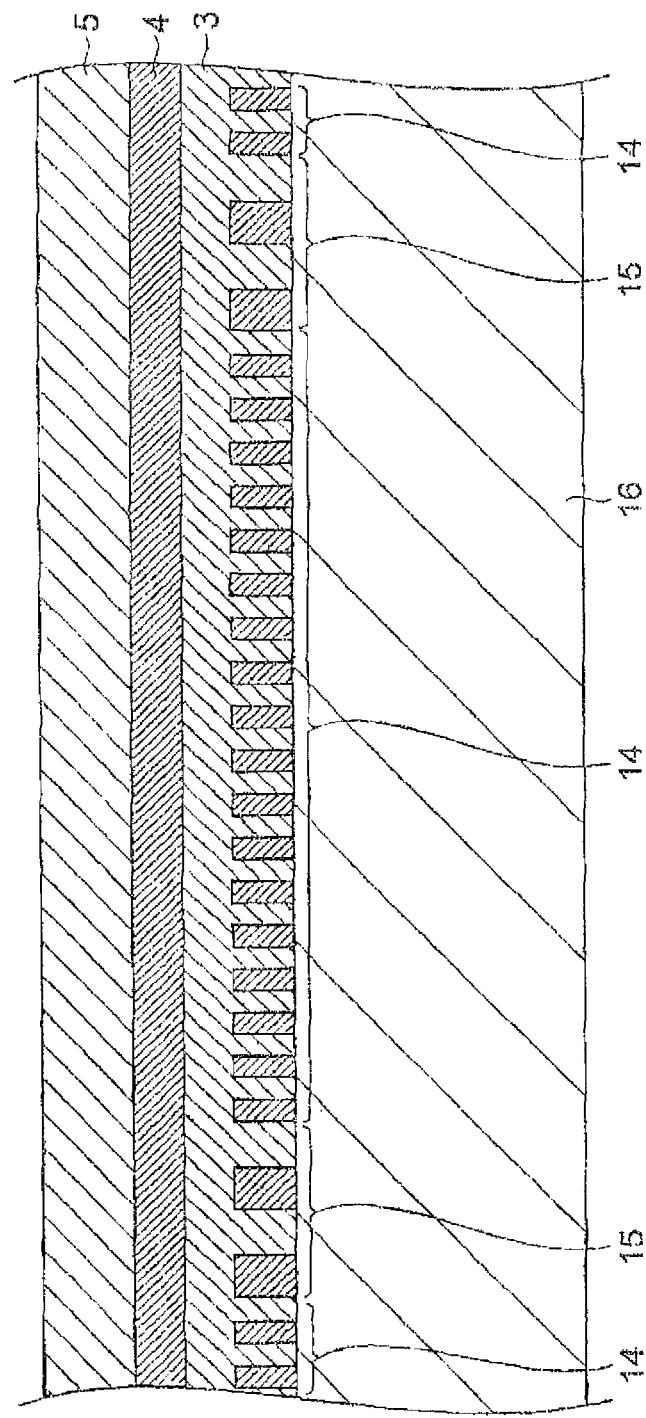
FIG. 8 is a diagram illustrating a manufacturing step of the semiconductor laser device.

After the first diffraction grating 14 and the second diffraction grating 15 are formed, as illustrated in FIG. 8, the n-type InP cladding layer 3, the active layer 4 and the p-type InP cladding layer 5 are sequentially grown on the wafer 16. At this time, the first diffraction grating 14 and the second diffraction grating 15 are embedded by the n-type InP cladding layer 3. The n-type InP cladding layer 3 is, for example, doped with Si (silicon) by a concentration of $1.0 \times 10^{18}/cm^3$. The thickness of the n-type InP cladding layer 3 is, for example, 0.5 μm. The active layer 4 has, for example, a multi quantum well (MQW) structure including AlInGaAs. The p-type InP cladding layer 5 is, for example, doped with Zn by a concentration of $1.0 \times 10^{18}/cm^3$. The thickness of the p-type InP cladding layer 5 is, for example 0.2 μm.

Figure 9:
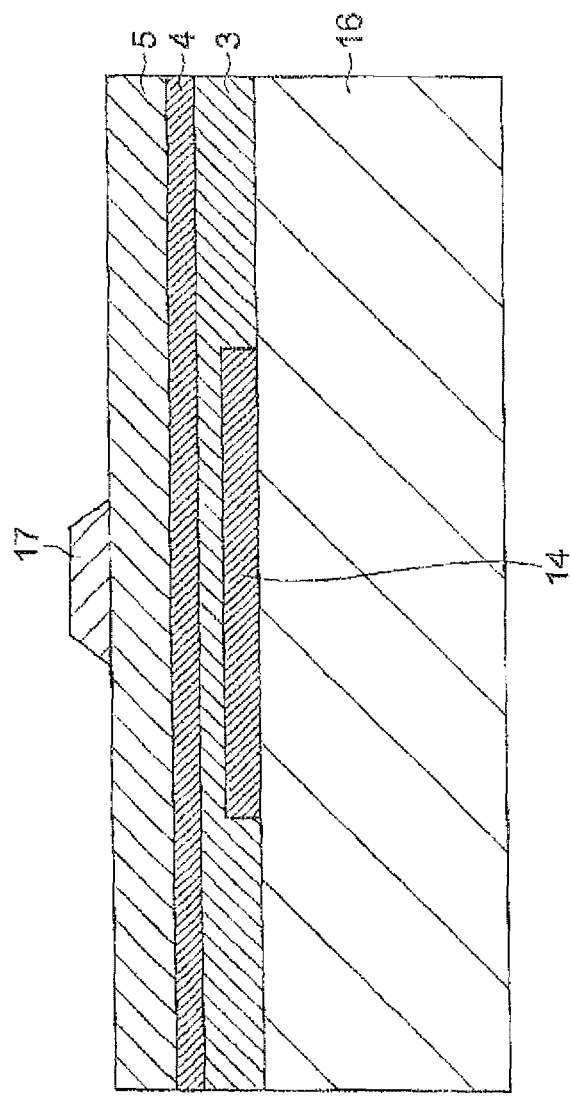
FIG. 9 is a diagram illustrating a manufacturing step of the semiconductor laser device.

Subsequently, as illustrated in FIG. 9, a mask 17 is formed on the p-type InP cladding layer 5 in a region where a mesa stripe comprising the n-type InP cladding layer 3, the active layer 4 and the p-type InP cladding layer 5 is to be formed. The mask 17 is, for example, an $SiO_2$ film having a thickness of 0.5 μm.

Figure 10:
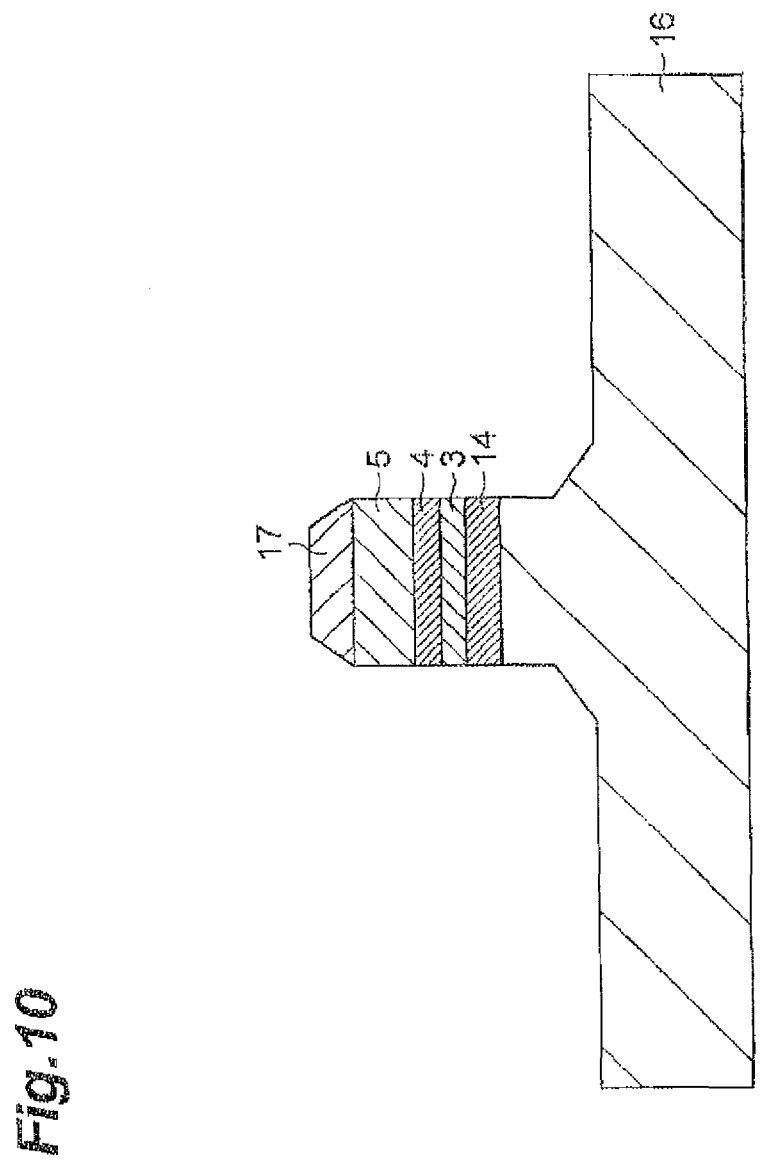
FIG. 10 is a diagram illustrating a manufacturing step of the semiconductor laser device.

Subsequently, as illustrated in FIG. 10, the dry etching is carried out for the p-type InP cladding layer 5, the active layer 4, the n-type InP cladding layer 3, and a part of the wafer 16 using the mask 17 as an etching mask. The dry etching forms a mesa stripe on the wafer 16. An RIE (Reactive Ion Etching) using $SiCl_4$ as an etching gas is available for the dry etching. The thickness of the mesa stripe except for the mask 17 is, for example, 2.0 μm.

Figure 11:
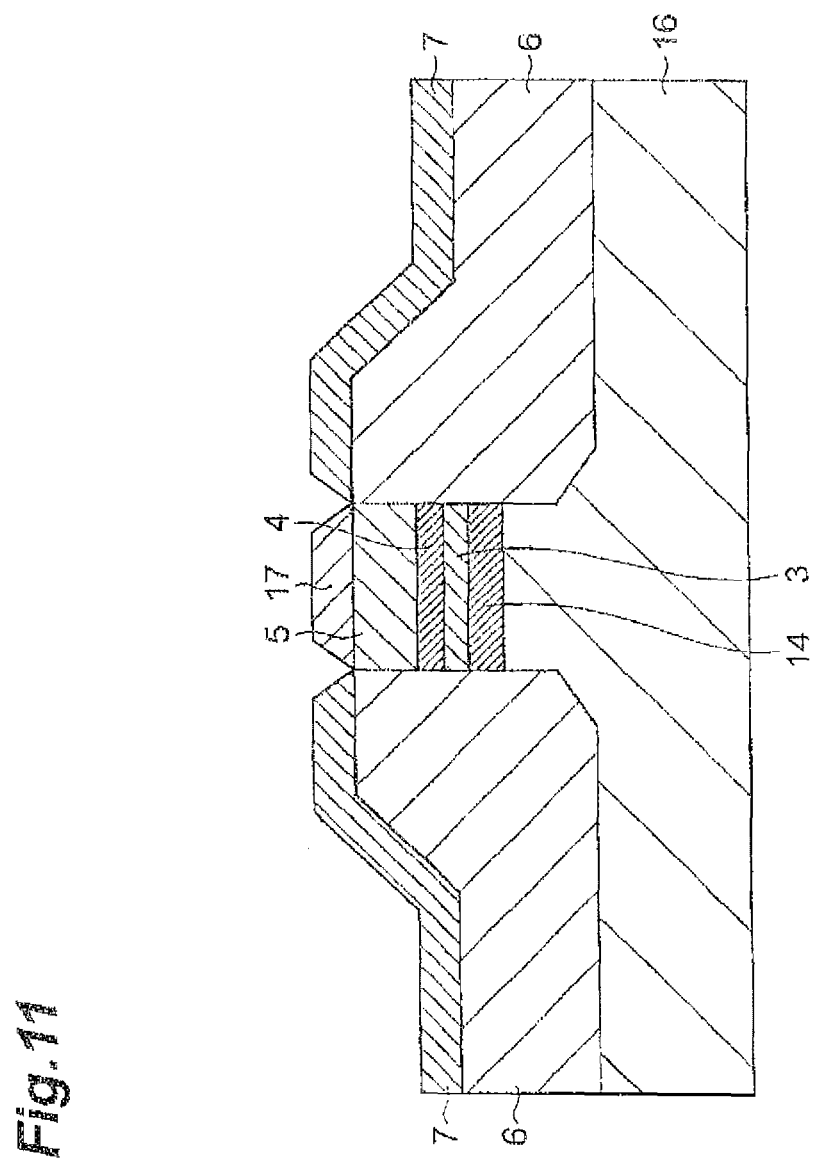
FIG. 11 is a diagram illustrating a manufacturing step of the semiconductor laser device.

Subsequently, as illustrated in FIG. 11, the p-type InP blocking layer 6 and the n-type InP blocking layer 7 are sequentially grown so as to bury both sides of the mesa stripe. The p-type InP blocking layer 6 is, for example, doped with Zn by a concentration of $4.0 \times 10^{17}/cm^3$. The thickness of the p-type InP blocking layer 6 is, for example, 3.0 μm. The n-type InP blocking layer 7 is, for example, doped with Si by a concentration of $1.0 \times 10^{19}/cm^3$. The thickness of the n-type InP blocking layer 7 is, for example, 0.4 μm.

Figure 12:
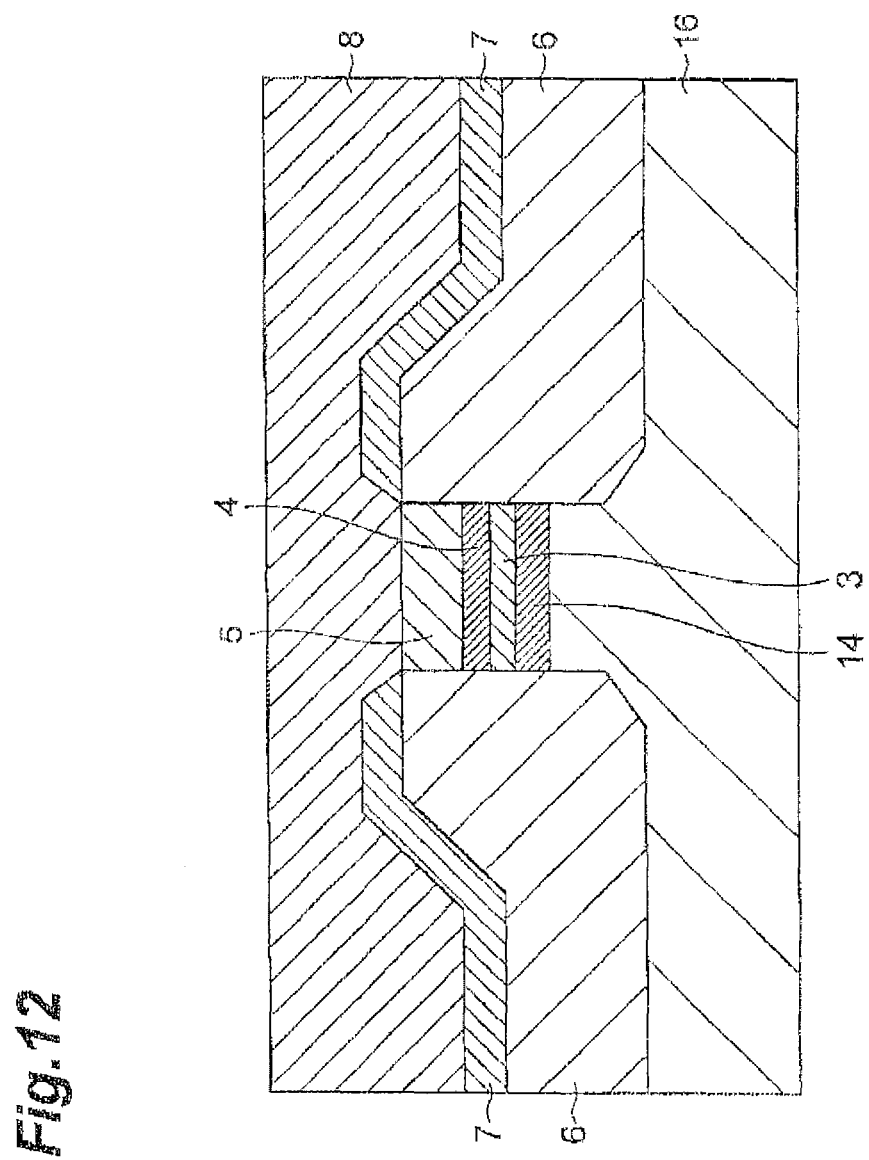
FIG. 12 is a diagram illustrating a manufacturing step of the semiconductor laser device.

Subsequently, as illustrated in FIG. 12, the mask 17 is removed using HF (hydrofluoric acid), or the like. Then, the p-type InP layer 8 is grown so as to cover an upper surface of the p-type InP cladding layer 5 and that of the n-type InP blocking layer 7. The grown p-type InP layer 8 continues to the p-type InP cladding layer 5 and operates as a part of the p-type InP cladding layer 5. The p-type InP layer 8 is, for example, doped with Zn by a concentration of $1.2 \times 10^{18}/cm^3$. The thickness of the p-type InP layer 8 is, for example, 2.0 μm.

Figure 13:
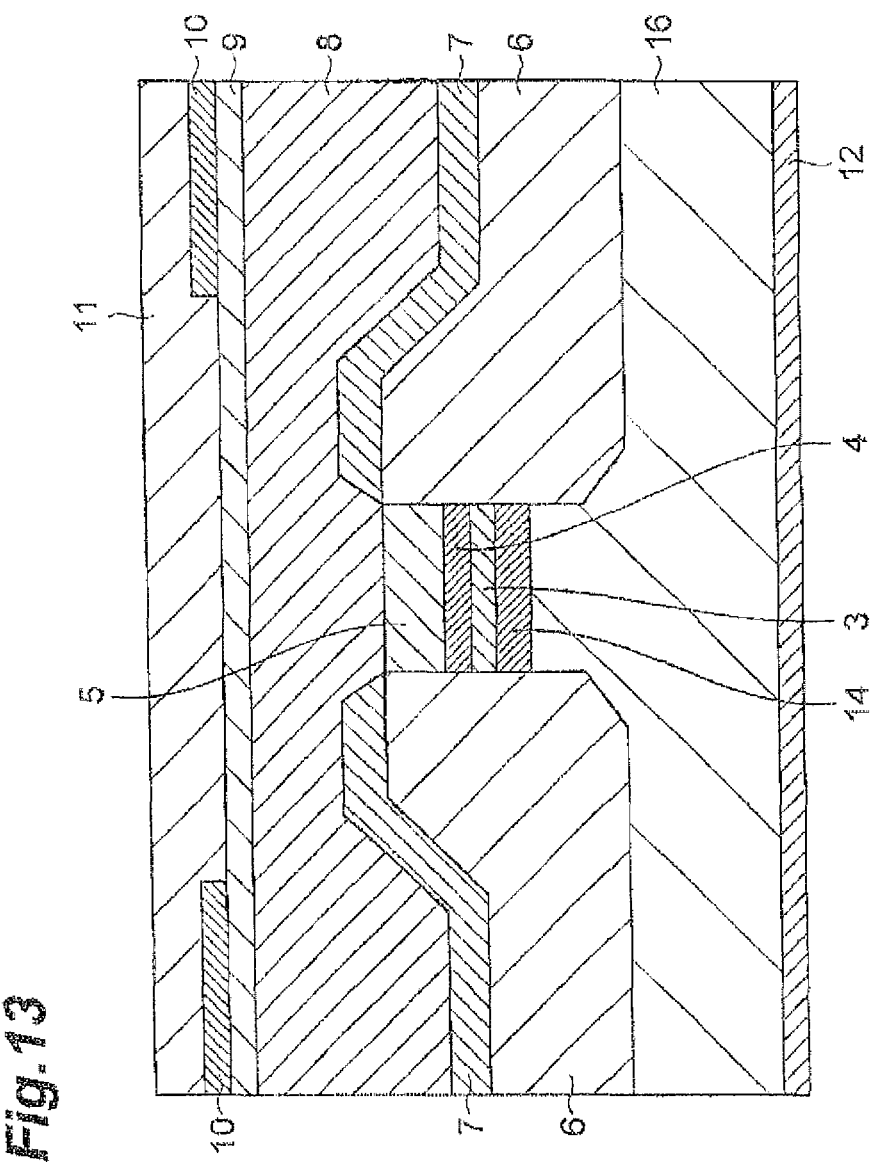
FIG. 13 is a diagram illustrating a manufacturing step of the semiconductor laser device.

Subsequently, as illustrated in FIG. 13, the contact layer 9 is grown on the p-type InP layer 8. The contact layer 9 is, for example, made of p-type InGaAs layer doped with Zn by a concentration of $1.2 \times 10^{19}/cm^3$. The thickness of the contact layer 9 is, for example, 0.5 μm. Then, a protective film 10 is formed on the contact layer 9 except for at least a region above the mesa stripe. A p-type electrode 11 is formed so as to cover the contact layer 9 exposed from the protective film 10, and the protective film 10 in a portion peripheral of the exposed contact layer 9. An n-type electrode 12 is formed on a bottom surface of the wafer 16. The protective film 10 is an insulating film and may be made of, for example, $SiO_2$, or the like. The p-type electrode 11 is, for example, a metal stack of titanium (Ti), platinum (Pt), and gold (Au). The n-type electrode 12 is, for example, a metal stack including gold (Au), germanium (Ge), and nickel (Ni). The above-described method forms a plurality of the semiconductor laser devices 1 illustrated in FIG. 1 on the wafer 16. Subsequently, to manufacture the semiconductor laser device 1 independently, the wafer 16 is cleaved in a region of the second diffraction grating 15. This cleavage forms a plurality of semiconductor laser devices 1.

Performing the processes described above, the semiconductor laser device 1 is completed. Advantages of the semiconductor laser device 1 according to the present embodiment will be described while comparing with a comparative example.

Figure 14:
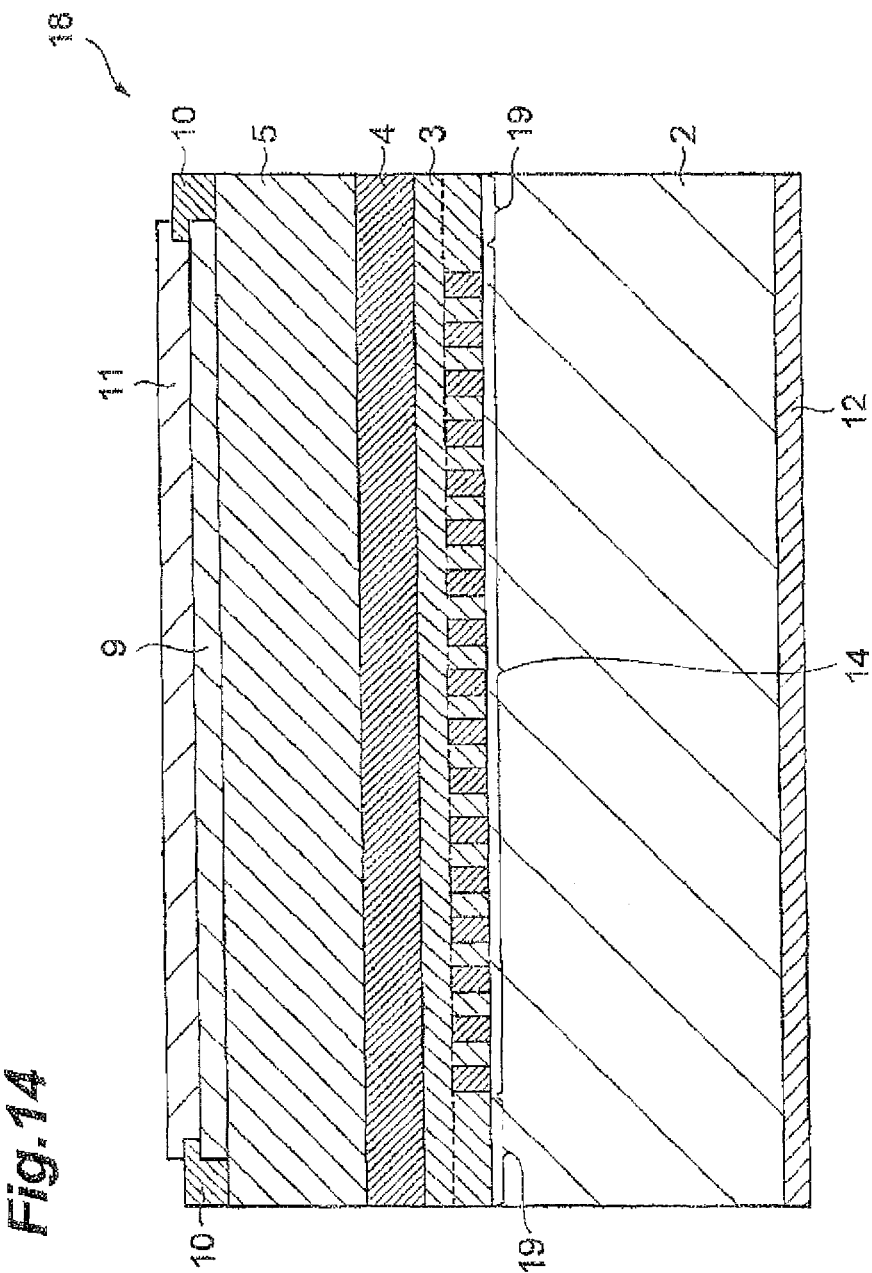
FIG. 14 is a cross-sectional view of a semiconductor laser device 18 according to a comparative example.

FIG. 14 is a cross-sectional view of a semiconductor laser device 18 according to the comparative example. The semiconductor laser device 18 has portions 19 where a diffraction grating is not formed, in respective ends of the first diffraction grating 14. Other arrangements of the semiconductor laser device 18 are the same as those of the semiconductor laser device 1. To form the semiconductor laser device 18, when the wafer 16 is cleaved, the portions 19 where no diffraction grating is formed are cleaved. That is, the portions 19 are set as cleaved positions of the wafer 16. If such portions 19 are formed in advance, growth conditions become different at both ends of the first diffraction grating 14 from those for a center portion thereof. Specifically, the density of periodic patterns for the gratings is different in the end portions from the center portion. Due to this difference, defects may be caused or arose from the both ends of the first diffraction grating 14, which results in a degraded crystal quality. The defects may invade in the active layer 4 to reduce the efficiency of the laser oscillation. On the other hand, in the semiconductor laser device 1 according to the present embodiment, the first diffraction grating 14 and the second diffraction grating 15 are continuously arranged along the optical waveguide direction. Therefore, the growth conditions are not likely to differ at both ends of the first diffraction grating 14. It is therefore possible to suppress the defects arose at both ends of the first diffraction grating 14 and to prevent the defects from invading within the active layer 4.

The difference of the growth conditions may be primarily reflected in the crystal quality of the n-type InP cladding layer 3 between regions near both ends and rest regions thereof. The defects arising from both ends of the first diffraction grating 14 are primarily arose at least in the n-type InP cladding layer 3, and do not restrict only to those arose in the ends.

If the second diffraction grating 15 has a pitch which may generate laser light, that is, the pitch thereof corresponds to a wavelength where a substantial laser gain is left, a laser oscillation may occur at a wavelength other than a desired wavelength determined by the first diffraction grating. To prevent such an unexpected laser oscillation, the pitch of the second diffraction grating 15 may fall within a range where the second diffraction grating 15 does not cause laser light, that is, a range showing substantially no laser gain is left. Specifically, the pitch of the second diffraction grating 15 may be 0.95 times or smaller, or 1.05 times or greater of the pitch of the first diffraction grating 14. The pitch of the second diffraction grating 15 may be preferably 0.8 times or smaller, or 1.2 times or greater of the pitch of the first diffraction grating 14. When the pitch of the second diffraction grating 15 falls within these ranges, the second diffraction grating 15 hardly causes laser light. Therefore, by designing the second diffraction grating 15 so that the pitch thereof falls within the above-described ranges, it is possible to prevent the second diffraction grating 15 from affecting the laser oscillation.

Figure 15:
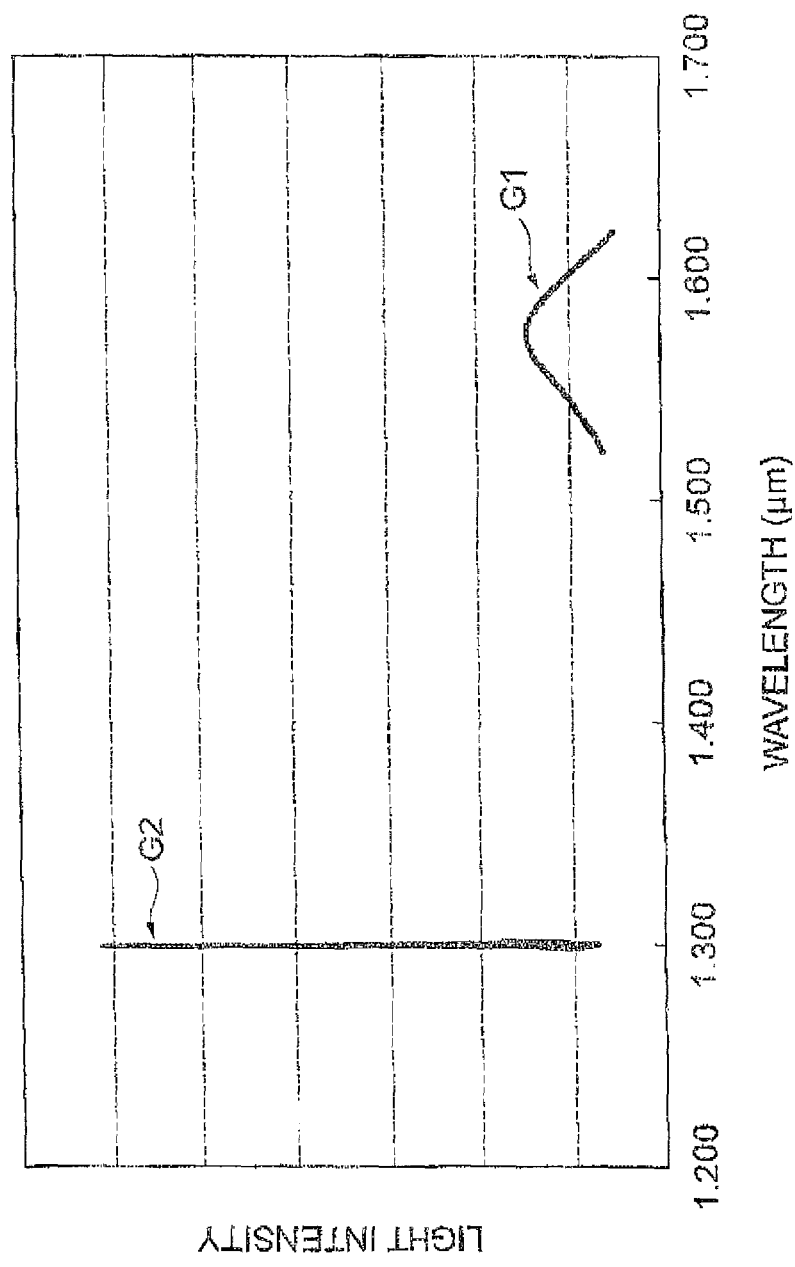
FIG. 15 is a diagram illustrating an optical gain of a MQW structure designed so that a laser oscillation wavelength becomes 1.5 μm, and a Bragg wavelength of 1.3 μm by a diffraction grating.

FIG. 15 is a diagram illustrating a laser gain G1 of a MQW structure designed so that a laser oscillation occurs at 1.500 μm, and a Bragg wavelength G2 for the second diffraction grating 15 of 1.300 μm. As illustrated in FIG. 15, when the MQW structure is designed so that the laser oscillation occurs at 1.500 μm, the laser device shows a substantial optical gain in a wavelength range between approximately 1.500 μm and 1.700 μm. In this case, even if the second diffraction grating 15 has a pitch causing a laser oscillation at 1.300 μm or smaller and the diffraction spectrum caused thereby is extremely cute as the behavior G2 in FIG. 15, light having a wavelength of 1.300 μm or shorter is scarcely hard to be generated because the laser device has no optical gain in those wavelengths. Thus, the influence of the second diffraction grating 15 on the laser oscillation is extremely small.

The pitch of the first diffraction grating 14 designed so that the laser oscillation occurs at 1.500 μm is 0.24 μm, and 0.8 times thereof is 0.192 μm. This value is smaller than 0.20 m which is the pitch of the first diffraction grating 14 designed so that the laser oscillation wavelength is 1.300 μm. By setting the pitch of the second diffraction grating 15 to be 0.192 μm, the second diffraction grating 15 will act only on light having a wavelength further shorter than 1.300 μm. In the present embodiment in which a gain is not provided at the above-described wavelength band at all, the influence of the second diffraction grating 15 on the laser oscillation is extremely small or substantially ignorable.

Second Embodiment

Figure 16:
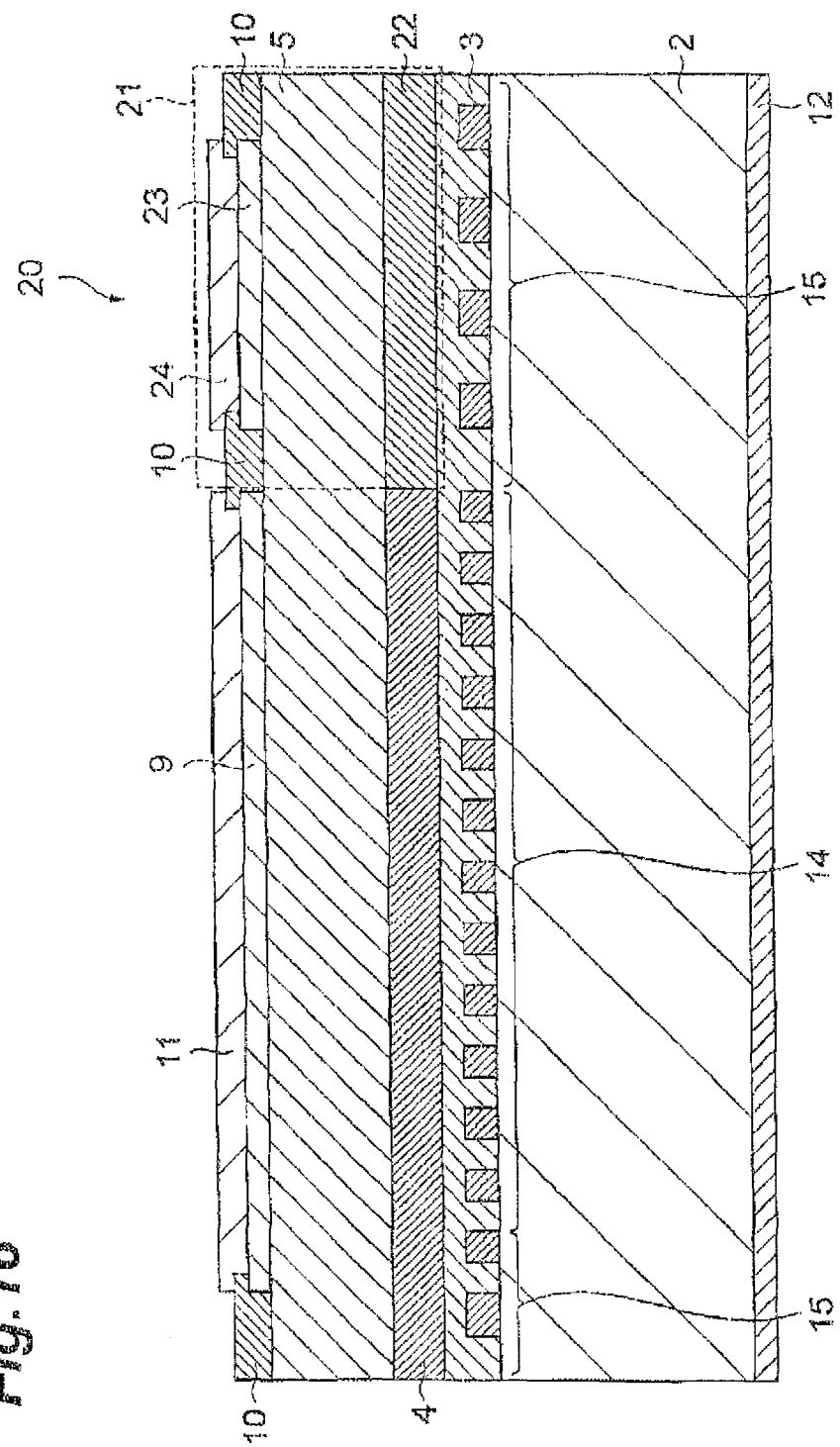
FIG. 16 is a cross-sectional view of a semiconductor laser device according to a second embodiment.

FIG. 16 is a cross-sectional view of a semiconductor laser device 20 according to a second embodiment. The semiconductor laser device 20 further includes a modulation region 21 in addition to the elements of the semiconductor laser device 1 of the first embodiment. The modulation region 21 which is provided above the second diffraction grating 15 has an optical waveguide 22, a contact layer 23 provided on the p-type InP cladding layer 5, and the p-type electrode 24 provided on the contact layer 23. The optical waveguide 22 may include a quantum well structure. The p-type InP cladding layer 5 in the modulation region 21 continues from the p-type InP cladding layer 5 provided on the active layer 4. In the semiconductor laser device 20, a modulation signal is applied between the p-type electrode 24 and the n-type electrode 12, so that laser light generated at the active layer 4 is modulated while passing through the optical waveguide 22. The optical waveguide 22 is formed using, for example, the following method. First, the active layer 4 illustrated in FIG. 8, or the like is selectively etched to the second diffraction grating 15. Then, a layer which becomes the optical waveguide 22 is selectively formed in a region where the active layer 4 is etched. The growth of the p-type InP cladding layer 5, or the like, after the optical waveguide 22 is formed is the same as that of the first embodiment.

In the semiconductor laser device 20 of the present embodiment, similar to the first embodiment, the first diffraction grating 14 and the second diffraction grating 15 are continuously disposed. Growth conditions for semiconductor layers, in particular, for the lower cladding layer 3, are not likely to change at both ends of the first diffraction grating 14. It is therefore possible to suppress crystal defects from being arose at the both ends of the first diffraction grating 14.

Third Embodiment

Figure 17:
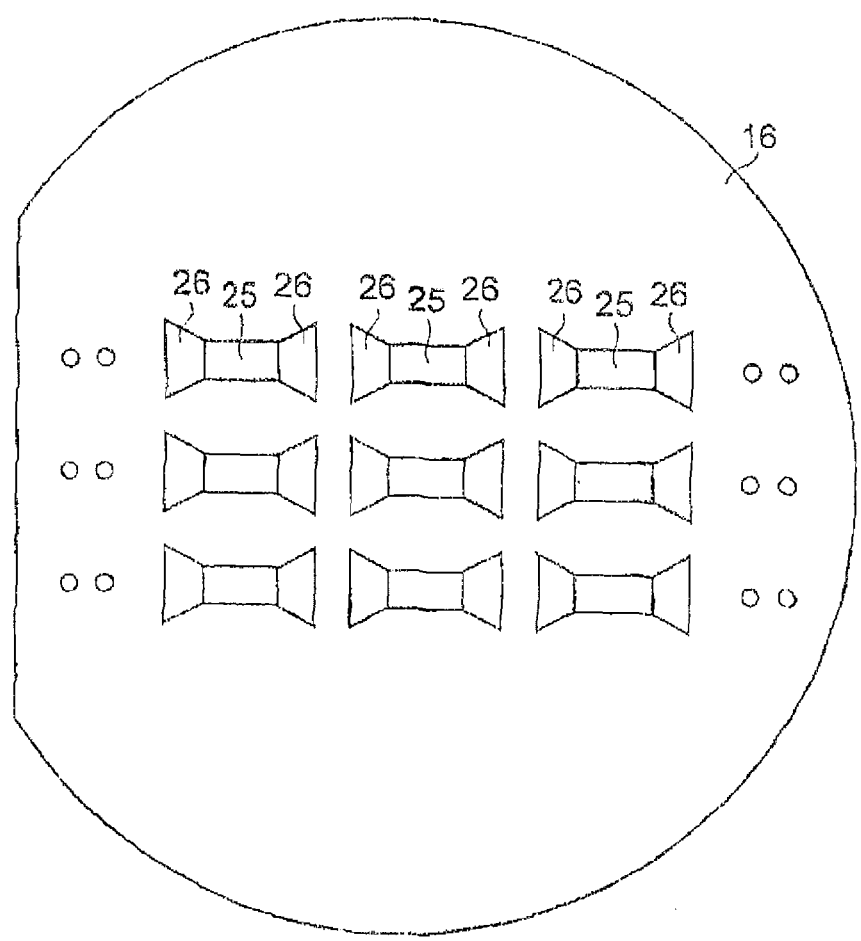
FIG. 17 is a diagram of a wafer viewed from a direction perpendicular to a principal surface of the wafer in a step of forming diffraction gratings on the wafer according to a third embodiment.
Figure 18:
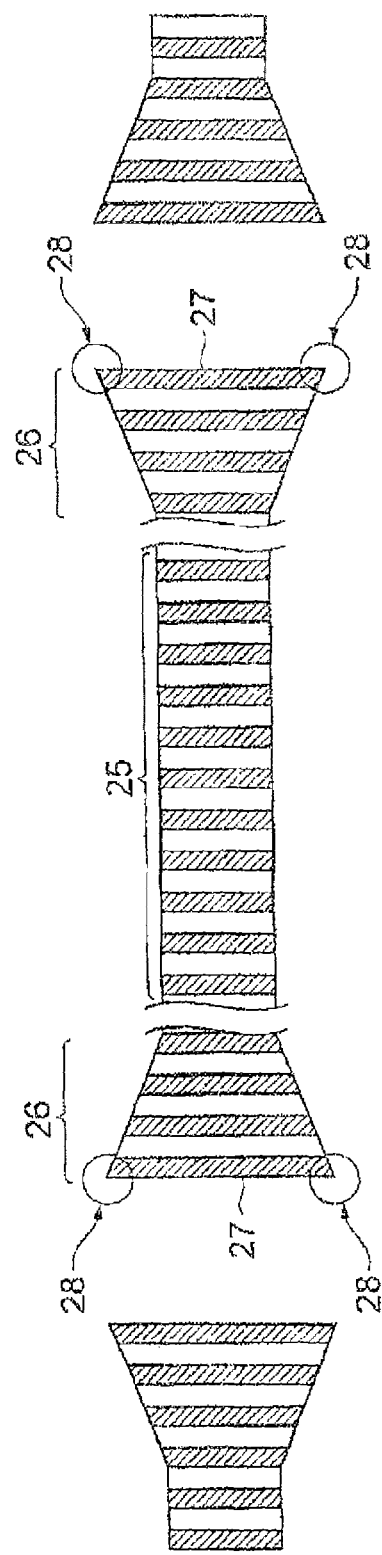
FIG. 18 magnifies a portion to be a semiconductor device in the wafer illustrated in FIG. 17.

FIG. 17 is a diagram of the wafer 16 viewed from a direction perpendicular to the principal surface of the wafer 16 in a step of forming diffraction gratings on a wafer 16 according to a third embodiment. FIG. 18 magnifies a portion of a semiconductor device among the wafer 16 illustrated in FIG. 17.

FIG. 17 and FIG. 18 illustrate the wafer 16, a third diffraction grating 25 and a fourth diffraction grating 26. The third diffraction grating 25 and the fourth diffraction grating 26 have the same pitch, and this pitch is the same as that of, for example, the first diffraction grating 14 of the first embodiment. The third diffraction grating 25 is formed in a stripe shape. On the other hand, the fourth diffraction grating 26 has a trapezoidal envelope, when viewed from a direction perpendicular to the principal surface of the wafer 16. Therefore, the end 27 has a width in a direction perpendicular to the optical waveguide direction two to three times wider than a width of the other end continuous to the third diffraction grating 25.

The width above described and a depth will be explained. In the pattern, which includes the end 27 and the other end, constituting the third diffraction grating 25 and the fourth diffraction grating 26, when viewed from the direction perpendicular to the principal surface of the wafer 16, a length in a direction along the optical waveguide direction is defined as the depth, and a length in a direction perpendicular to the optical waveguide direction is defined as the width. The third diffraction grating 25 corresponds to an aggregate in which the patterns constituting the third diffraction grating 25 are periodically and linearly arranged along the optical waveguide direction. The widths of the patterns constituting the third diffraction grating 25 are uniform or substantially uniform. A width of the third diffraction grating 25 corresponds to the widths of the respective patterns constituting the third diffraction grating 25. The widths of the respective patterns constituting the fourth diffraction grating 26 are gradually lengthened from the boundary to the third diffraction grating 25 toward an opposite side of the third diffraction grating 25, when viewed from the direction perpendicular to the principal surface of the wafer 16. Therefore, the width of the end 27 which is one of the patterns constituting the fourth diffraction grating 26 is greater than the width of the third diffraction grating 25.

Figure 19:
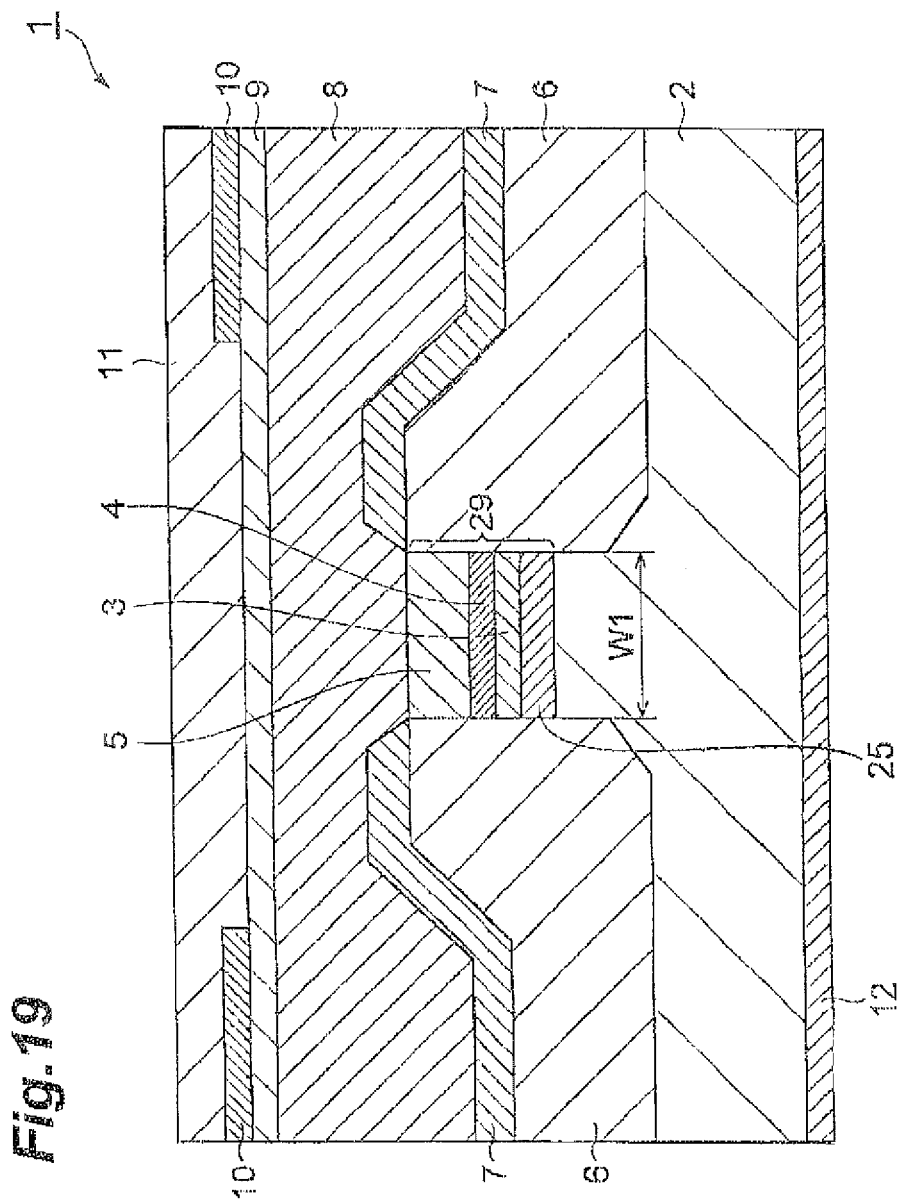
FIG. 19 is a diagram illustrating a cross-section of the semiconductor laser device according to the third embodiment, the cross-section perpendicular to an optical waveguide direction.

FIG. 19 is a diagram illustrating a cross-section of the semiconductor laser device 1 according to the third embodiment, the cross-section perpendicular to the optical waveguide direction. As illustrated in FIG. 19, a width W1 of a mesa stripe 29 which overlaps with the third diffraction grating 25 is equal to or narrower than a width W2 of the third diffraction grating 25. This mesa stripe 29 is constituted by the etched n-type InP cladding layer 3, the etched active layer 4 and the etched p-type InP cladding layer 5 above the third diffraction grating 25 and the fourth diffraction grating 26.

Manufacturing steps of the semiconductor laser device according to the present embodiment is the same as the manufacturing steps of the semiconductor laser device 1 according to the first embodiment except steps to form a diffraction grating illustrated in FIG. 4 to FIG. 6 of the first embodiment. That is, while, in the first embodiment, the first diffraction grating 14 and the second diffraction grating 15 are formed in the steps illustrated in FIG. 4 to FIG. 6. However, in the present embodiment, the third diffraction grating 25 and the fourth diffraction grating 26 are formed by steps different from those for the first diffraction grating 14 and the second diffraction grating 15.

In the process for manufacturing the semiconductor laser device according to the present embodiment, defects may be arose from the end 27 of the fourth diffraction grating 26 during epitaxial growth of the lower cladding layer 3. The defects are eccentrically located at both corners 28 of the end 27. Therefore, after the mask 17 illustrated in FIG. 9 to form the mesa stripe 29 is formed so as not to overlap with the corners 28 by etching the layers, 3 to 5, as those illustrated in FIG. 10, most of the defects will be removed. It is therefore possible to suppress the defects from invading into the active region in the active layer 4.

Fourth Embodiment

Figure 20:
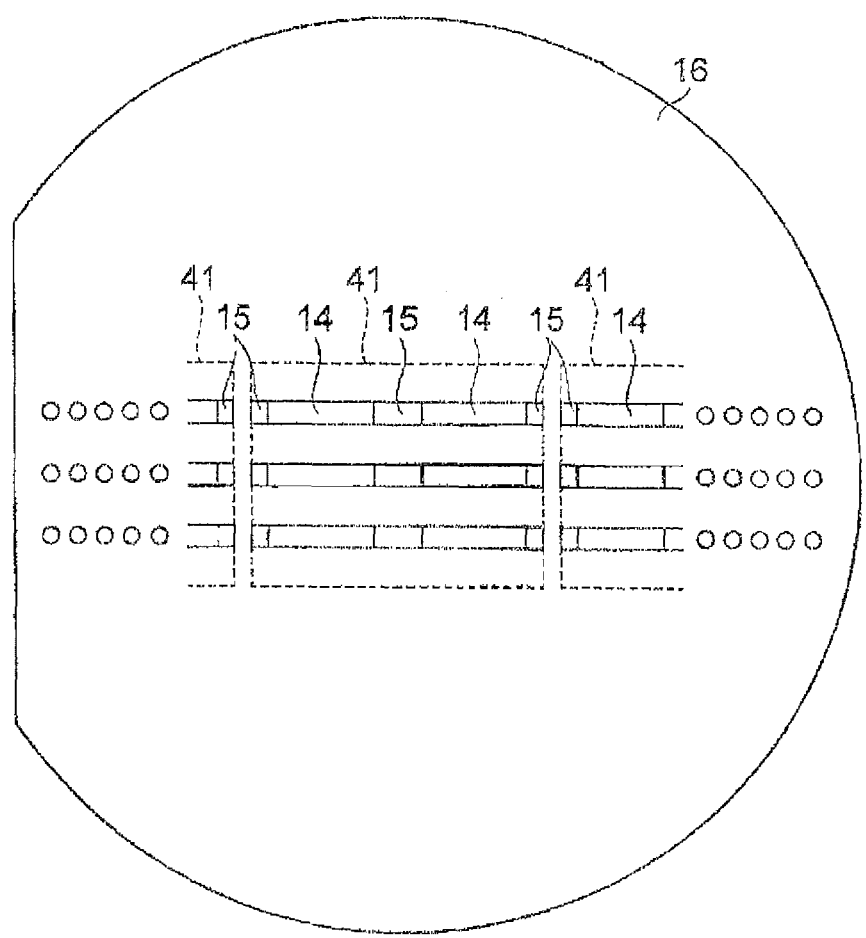
FIG. 20 is a diagram of the wafer viewed from the direction perpendicular to the principal surface of the wafer in a step for forming diffraction gratings on the wafer according to a fourth embodiment.
Figure 21:
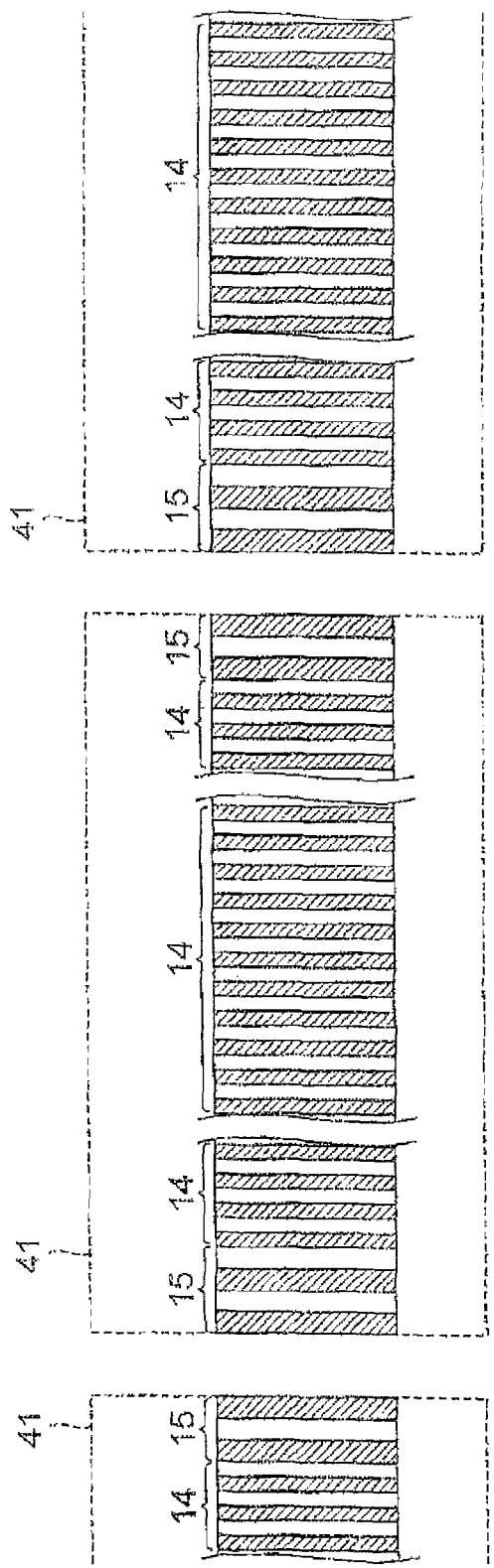
FIG. 21 magnifies a portion to be a semiconductor device later in the wafer illustrated in FIG. 20.

FIG. 20 is a diagram of the wafer 16 viewed from a direction perpendicular to the principal surface of the wafer 16 in a step of forming diffraction gratings on the wafer 16 according to a fourth embodiment. FIG. 21 is a magnified view of a portion to be a semiconductor laser device later.

As illustrated in FIG. 20 and FIG. 21, regions 41 each including at least one first diffraction grating 14 and one second diffraction grating 15 continuous to the one first diffraction grating 14 are discretely provided on the wafer 16 along the optical waveguide direction. When the first diffraction grating 14 and the second diffraction grating 15 are formed, the respective positions of these regions 41 are irradiated with electron beams. Accordingly, the regions 41 are referred to as the exposed regions which are exposed to the electron beams.

Figure 22:
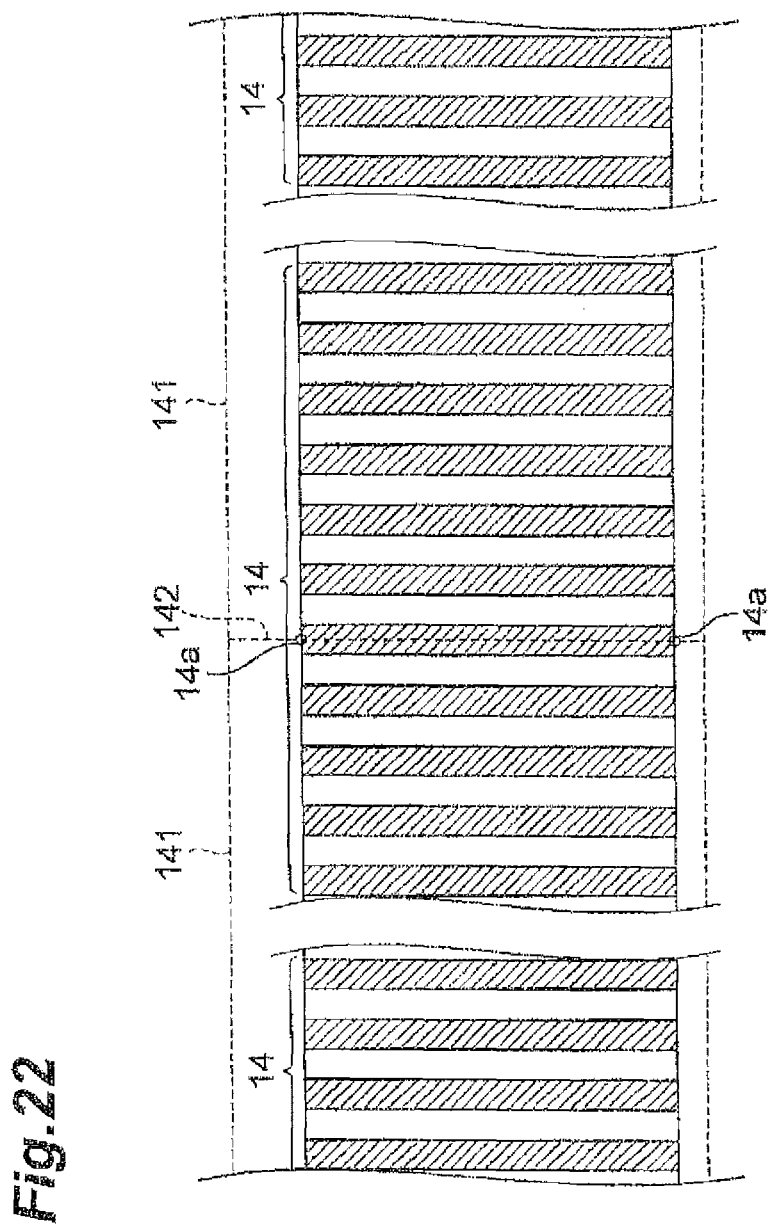
FIG. 22 magnifies a part of a first diffraction grating according to the comparative example.

FIG. 22 magnifies the first diffraction grating according to the comparative example. As illustrated in FIG. 22, the second diffraction grating 15 is not provided in the semiconductor laser device according to the comparative example. Also, a plurality of regions 141 exposed to electron beams are continuously provided so as to couple with each other along the optical waveguide direction. In this case, a coupling portion 142 in the boundary of two regions 141 is irradiated with electron beams at least twice. Therefore, the first diffraction grating 14 overlapping with the boundary 142 is likely to irregular growth of the lower cladding layer 3. Particularly, corners 14a of the first diffraction grating 14 is more likely to grow the lower cladding layer 3 irregularly. When the irregular growth appears in the lower cladding layer 3 and/or the layers thereon in the first diffraction grating 14, the shape of the mesa stripe in the first diffraction grating 14 degrades, which may deteriorate luminescent efficiency of the semiconductor laser device.

On the other hand, in the present embodiment, regions 41 including at least one first diffraction grating 14 and one second diffraction grating 15 which continues to the first diffraction grating 14 are provided so as to provide a space without any gratings against the next region 41 along the optical waveguide direction. Because the regions 41 do not overlap with each other in the optical waveguide direction, no first diffraction grating 14 and no second diffraction grating 15 are exposed to electron beams a plurality of times. By this means, the irregular growth of the semiconductor layers, 3 to 4, in the first diffraction grating 14 and the second diffraction grating 15 is suppressed; accordingly, a semiconductor laser device may show favorable luminescent efficiency.

Fifth Embodiment

Figure 23:
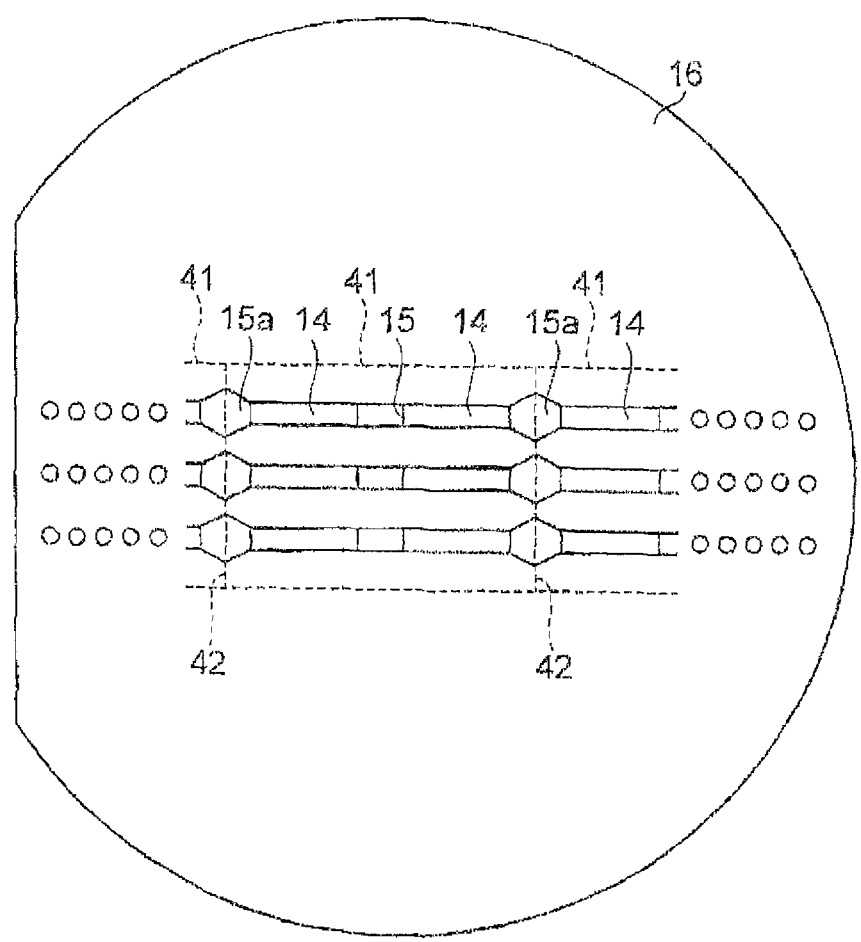
FIG. 23 is a diagram of the wafer viewed from the direction perpendicular to the principal surface of the wafer in a step of forming diffraction gratings on the wafer according to a fifth embodiment.
Figure 24:
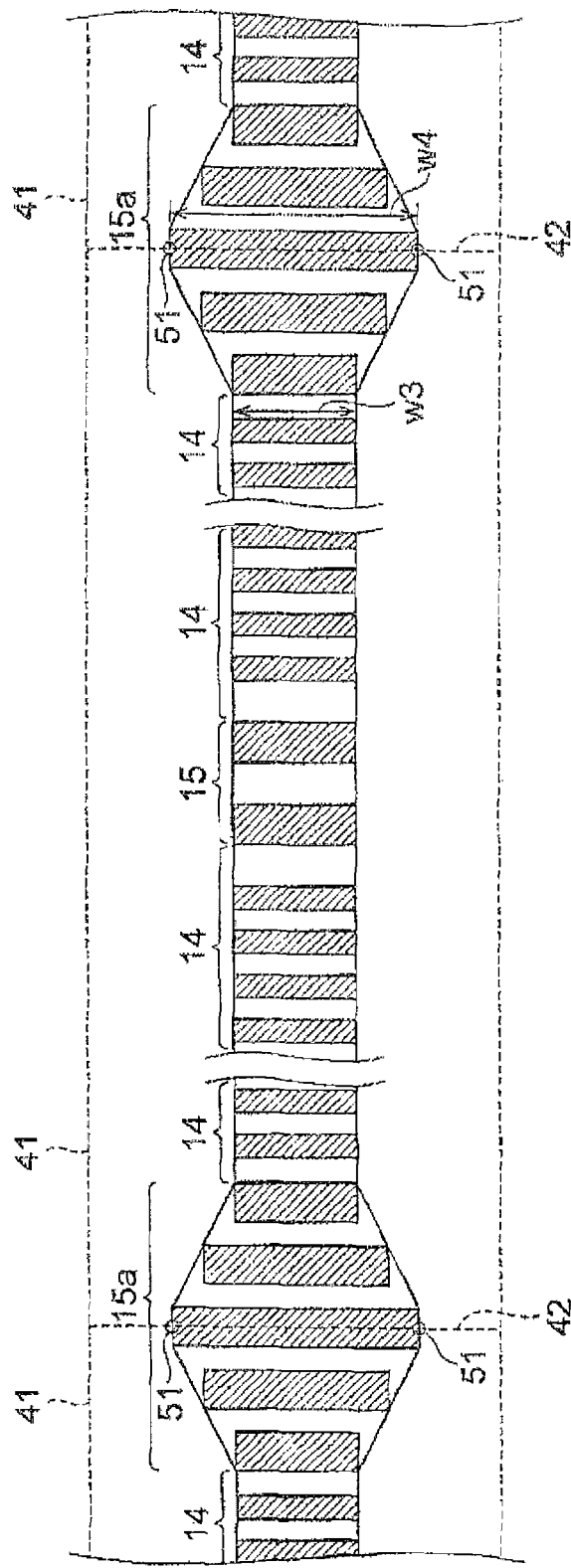
FIG. 24 magnifies a portion to be a semiconductor device later in the wafer illustrated in FIG. 23.

FIG. 23 is a diagram of the wafer 16 viewed from a direction perpendicular to the principal surface of the wafer 16 in a step of forming diffraction gratings on the wafer 16 according to a fifth embodiment. FIG. 24 is an enlarged view of a portion to be a semiconductor device later among the wafer 16 illustrated in FIG. 23.

As illustrated in FIG. 23 and FIG. 24, similar to the fourth embodiment, regions 41 including at least one first diffraction grating 14 and one second diffraction grating 15 continuous to the first diffraction grating 14 are provided on the wafer 16. In the present embodiment, the regions 41 are formed continuously along the optical waveguide direction. A boundary 42 between the regions 41 is provided so as to overlap with a diffraction grating 15a which is a part of the second diffraction gratings 15. The diffraction grating 15a has a width W4 which is wider than a width (first width) W3 of the first diffraction grating 14. The boundary 42 is provided so as to overlap with the diffraction grating 15a having the width W4. This boundary 42 is irradiated with electron beams at least twice when the first diffraction grating 14 and the second diffraction grating 15 are formed.

In the present embodiment, similar to the third embodiment, a mesa stripe having a width equal to or narrower than the width W3 of the first diffraction grating 14 is formed by etching the lower cladding layer 3, the active layer 4, and the upper cladding layer 5. By the etching, in the width direction of the mesa stripe, the lower cladding layer 3, the active layer 4, and the upper cladding layer 5 outside the mesa stripe are removed.

In the present embodiment, the boundary 42 where the regions 41 are coupled to each other and exposed to electron beams at least twice is provided to overlap with the second diffraction grating 15. The width W4 of the diffraction grating 15a overlapping with the boundary 42 in the second diffraction grating 15 is wider than the width W3 of the first diffraction grating 14. Accordingly, portions causing the abnormal growth of the lower cladding layer 3 and so on are eccentrically located outside the mesa stripe in the width direction of the mesa stripe, that is, the width direction of the first diffraction grating 14. The portions of the lower cladding layer 3, which are abnormally grown and localized in the boundary, are removed by the subsequent etching to form the mesa stripe. Influence of the abnormal growth in the lower cladding layer 3 on the property of the mesa stripe is suppressed or substantially prevented, so that a semiconductor laser device having favorable luminescent efficiency may be available.

The semiconductor laser device and the manufacturing method of the semiconductor laser device according to the present invention are not limited to the above-described embodiments, and can be modified in various ways. For example, while, in the above-described embodiments, the second diffraction gratings are adjacent to both ends of the first diffraction grating, the second diffraction grating may be adjacent to one end of the first diffraction grating. In the first embodiment and the second embodiment, the stripe width of the mesa stripe may be equal to or smaller than the width W3 of the first diffraction grating 14 as in the third embodiment. Other embodiments (for example, the third embodiment) can be applied to an embodiment (for example, the first embodiment) as appropriate within the technically possible range.

What is claimed is:

1. A method of manufacturing a semiconductor laser device comprising steps of:
   forming a first diffraction grating and a second diffraction grating continuous to the first diffraction grating on a wafer using an electron beam exposure, the first diffraction grating having a width and the second diffraction grating having a width wider than the width of the first diffraction grating;
   forming an active layer above the first diffraction grating and the second diffraction grating; and
   forming a mesa in a stripe shape by etching the first diffraction grating, the second diffraction grating and the active layer, the mesa in a portion thereof corresponding to the first diffraction grating having a width narrower than a width in another portion of the mesa corresponding to the second diffraction grating.

2. The method according to claim 1, further comprising:
   exposing a cleaved face by cleaving the wafer at a portion where the second diffraction grating exists.

3. The method according to claim 1, further comprising:
   forming a waveguide layer above the second diffraction grating after etching the active layer.

4. The method according to claim 1, further comprising:
   forming a modulation region above the second diffraction grating after etching the active layer.

5. A method of manufacturing a semiconductor laser device, comprising steps of:
   forming a first diffraction grating and a second diffraction grating on a wafer continuously by steps of:
      forming a grating layer on the wafer; and
      forming a plurality of exposed regions by a continuous electron beam exposure, the exposed regions each including a first pattern and two second patterns sandwiching the first pattern therebetween, the first pattern corresponding to the first diffraction grating and having a first width and a first pitch, the second patterns corresponding to the second diffraction grating and having a second pitch different from the first pitch of the first pattern, the second pattern in one of the exposed regions being exposed to electron beams at least twice, the second pattern in the one of the exposed regions having a width greater than the first width of the first pattern in a portion continuous to the second pattern in another of the exposed regions next to the one of the exposed regions;
   forming an active layer above the first diffraction grating and the second diffraction grating; and
   forming a mesa stripe having a width equal to or narrower than the first width of the first pattern by etching the first diffraction grating, the second diffraction grating, and the active layer,
   wherein the step of forming the first diffraction grating and the second diffraction grating includes a step of setting the second pitch of the second pattern of the second diffraction grating at least 1.05 times greater than the first pitch of the first pattern of the first diffraction grating.

6. The method according to claim 5, further comprising a step of:
   forming a waveguide layer above the second diffraction grating after etching the active layer in a portion above the second diffraction grating.

7. The method according to claim 5,
   further comprising a step of cleaving the wafer in the second diffraction grating after the step of forming the mesa stripe.

8. A method of manufacturing a semiconductor laser device, comprising steps of:

forming a first diffraction grating and a second diffraction grating on a wafer continuously by steps of:
    forming a grating layer on the wafer; and
    forming a plurality of exposed regions by a continuous electron beam exposure, the exposed regions each including a first pattern and two second patterns sandwiching the first pattern therebetween, the first pattern corresponding to the first diffraction grating and having a first width and a first pitch, the second patterns corresponding to the second diffraction grating and having a second pitch different from the first pitch of the first pattern, the second pattern in one of the exposed regions being exposed to electron beams at least twice, the second pattern in the one of the exposed regions having a width greater than the first width of the first pattern in a portion continuous to the second pattern in another of the exposed regions next to the one of the exposed regions;
forming an active layer above the first diffraction grating and the second diffraction grating; and
forming a mesa stripe having a width equal to or narrower than the first width of the first pattern by etching the first diffraction grating, the second diffraction grating, and the active layer,
wherein the step of forming the first diffraction grating and the second diffraction grating includes a step of setting the second pitch of the second pattern of the second diffraction grating at most 0.95 times smaller than the first pitch of the first pattern of the first diffraction grating.

9. The method according to claim 8, further comprising a step of:
    forming a waveguide layer above the second diffraction grating after etching the active layer in a portion above the second diffraction grating.

10. The method according to claim 8,
further comprising a step of cleaving the wafer in the second diffraction grating after the step of forming the mesa stripe.

* * * * *